United States Patent
Kao et al.

(10) Patent No.: US 11,907,007 B2
(45) Date of Patent: Feb. 20, 2024

(54) CLOCK SIGNAL DISTRIBUTION SYSTEM, INTEGRATED CIRCUIT DEVICE AND METHOD

(71) Applicant: TAIWAN SEMICONDUCTOR MANUFACTURING COMPANY, LTD., Hsinchu (TW)

(72) Inventors: Jerry Chang Jui Kao, Hsinchu (TW); Huang-Yu Chen, Hsinchu (TW); Sheng-Hsiung Chen, Hsinchu (TW); Jack Liu, Hsinchu (TW); Yung-Chen Chien, Hsinchu (TW); Wei-Hsiang Ma, Hsinchu (TW); Chung-Hsing Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 529 days.

(21) Appl. No.: 17/140,399

(22) Filed: Jan. 4, 2021

(65) Prior Publication Data
US 2022/0214712 A1     Jul. 7, 2022

(51) Int. Cl.
*G06F 1/10*     (2006.01)
*G06F 30/396*   (2020.01)

(52) U.S. Cl.
CPC .............. *G06F 1/10* (2013.01); *G06F 30/396* (2020.01)

(58) Field of Classification Search
CPC ............ G06F 1/10; G06F 30/396; H03K 5/15
USPC .......................................................... 327/293
See application file for complete search history.

(56) References Cited

U.S. PATENT DOCUMENTS

| | | | | |
|---|---|---|---|---|
| 6,088,254 A * | 7/2000 | Kermani | ................ | G11C 5/063 365/63 |
| 6,311,313 B1 * | 10/2001 | Camporese | ............... | G06F 1/10 716/113 |
| 6,912,704 B1 * | 6/2005 | Teig | ...................... | G06F 30/392 716/135 |
| 6,941,532 B2 * | 9/2005 | Haritsa | .................. | G06F 30/33 716/114 |
| 7,117,470 B1 * | 10/2006 | Teig | ...................... | G06F 30/394 716/55 |
| 7,178,124 B1 * | 2/2007 | Makarov | ................. | G06F 30/39 716/124 |
| 7,260,442 B2 | 8/2007 | Hwang et al. | | |
| 7,644,384 B2 * | 1/2010 | Teig | ...................... | G06F 30/394 716/126 |
| 7,661,086 B1 * | 2/2010 | Pitkethly | ................... | G06F 1/10 257/691 |
| 7,730,440 B2 * | 6/2010 | Pitkethly | ................... | G06F 1/10 327/295 |
| 7,730,441 B2 * | 6/2010 | Teig | ......................... | G06F 1/10 716/126 |

(Continued)

*Primary Examiner* — Ryan Jager
(74) *Attorney, Agent, or Firm* — Hauptman Ham, LLP

(57) ABSTRACT

A clock distribution system includes a clock mesh structure which has a plurality of first metal patterns extending along a first axis, a plurality of second metal patterns extending along a second axis, a plurality of third metal patterns extending along a third axis. The plurality of first metal patterns, the plurality of second metal patterns, and the plurality of third metal patterns are electrically coupled with each other. The second axis is transverse to the first axis. The third axis is oblique to both the first axis and the second axis.

20 Claims, 19 Drawing Sheets

(56) References Cited

U.S. PATENT DOCUMENTS

| | | | |
|---|---|---|---|
| 8,438,525 B2* | 5/2013 | Teig | G06F 1/10 |
| | | | 716/139 |
| 8,671,378 B2* | 3/2014 | Teig | G06F 30/394 |
| | | | 716/113 |
| 9,256,709 B2 | 2/2016 | Yu et al. | |
| 2003/0005399 A1* | 1/2003 | Igarashi | G06F 30/39 |
| | | | 716/119 |
| 2011/0102402 A1* | 5/2011 | Han | H10K 59/1315 |
| | | | 438/34 |
| 2014/0040838 A1 | 2/2014 | Liu et al. | |
| 2015/0278429 A1 | 10/2015 | Chang | |
| 2017/0083654 A1* | 3/2017 | Chuang | G06F 30/398 |
| 2022/0214712 A1* | 7/2022 | Kao | G06F 1/10 |
| 2023/0068280 A1* | 3/2023 | Lin | H01L 27/07 |

\* cited by examiner

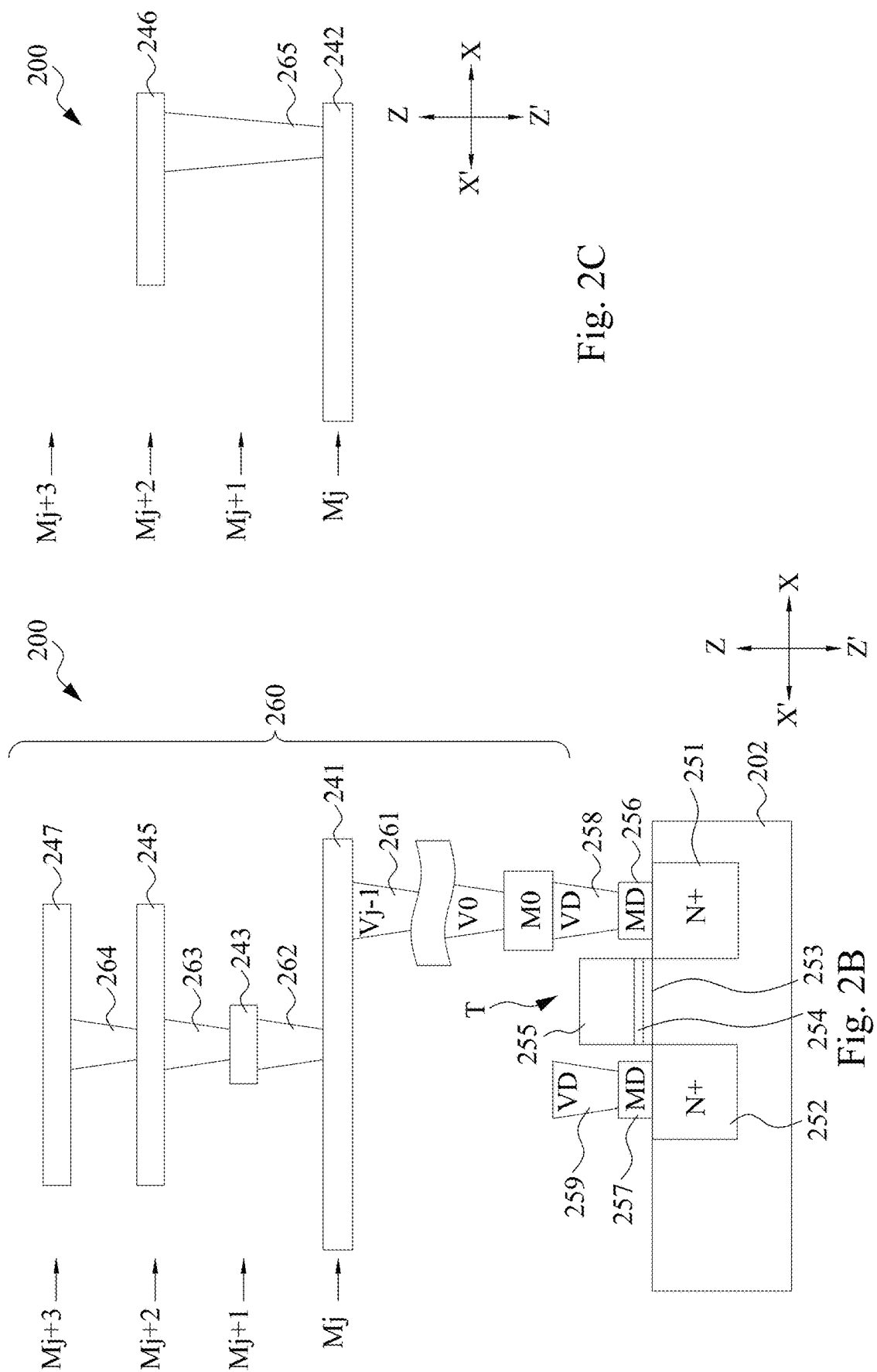

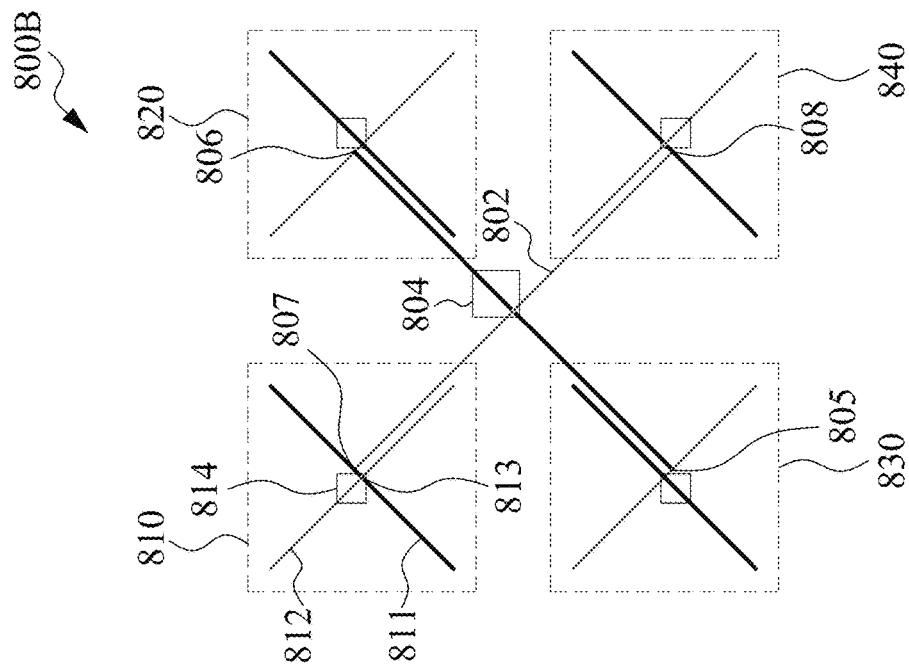
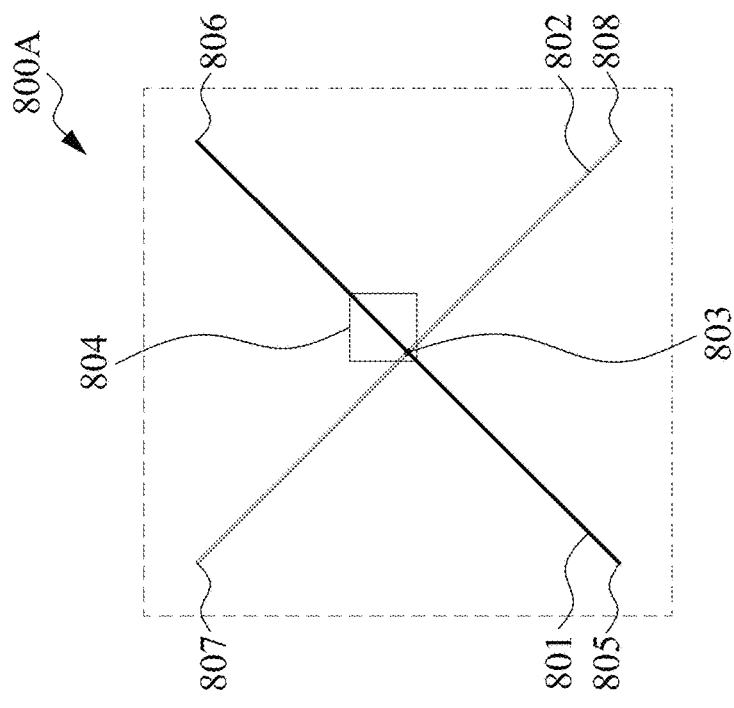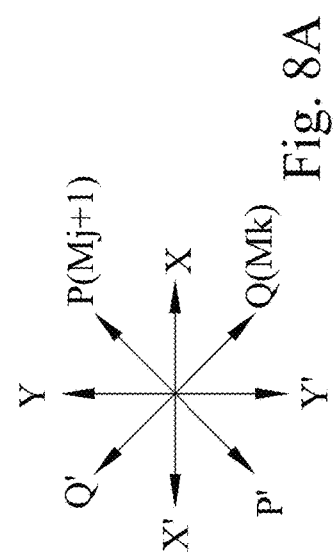
Fig. 8B
Fig. 8A

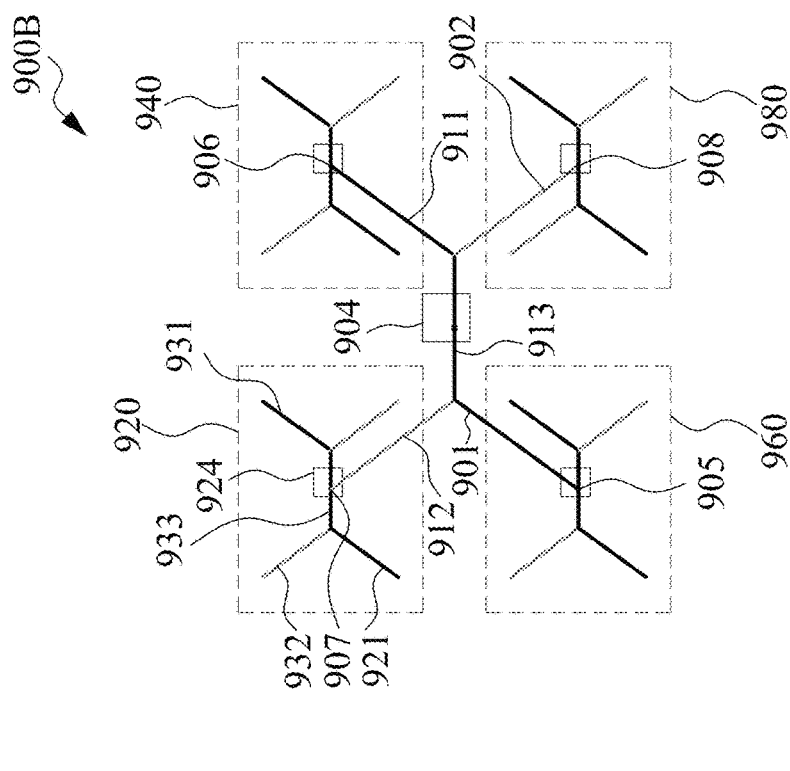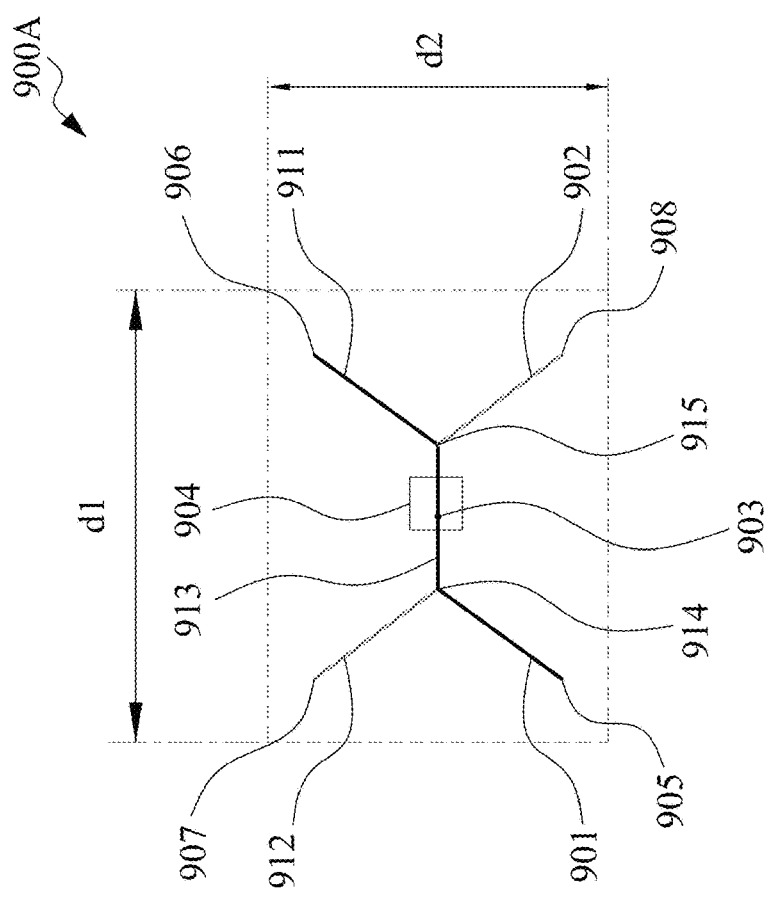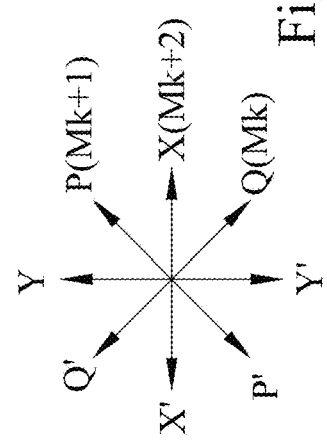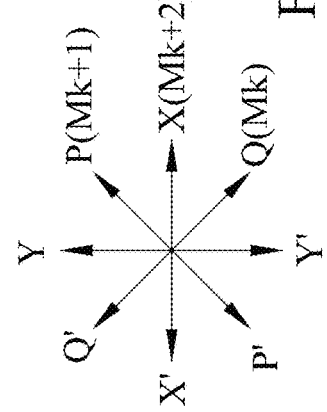
Fig. 9B
Fig. 9A

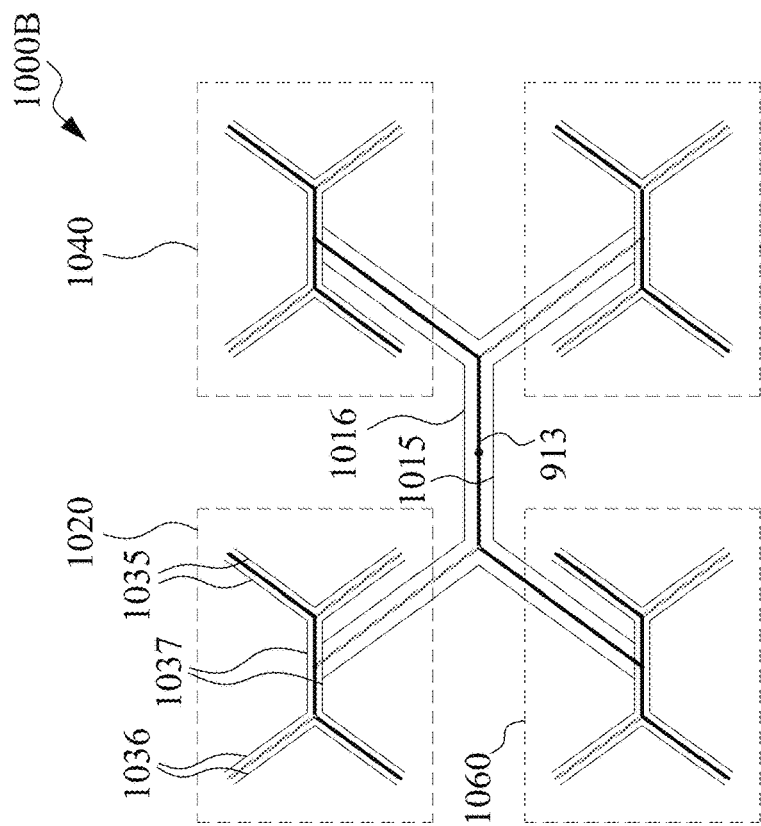
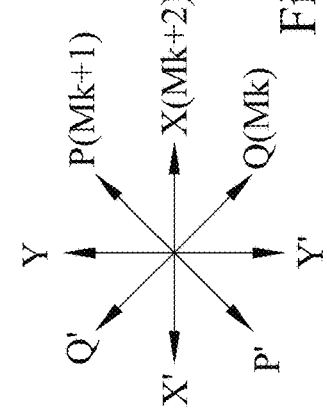
Fig. 10A
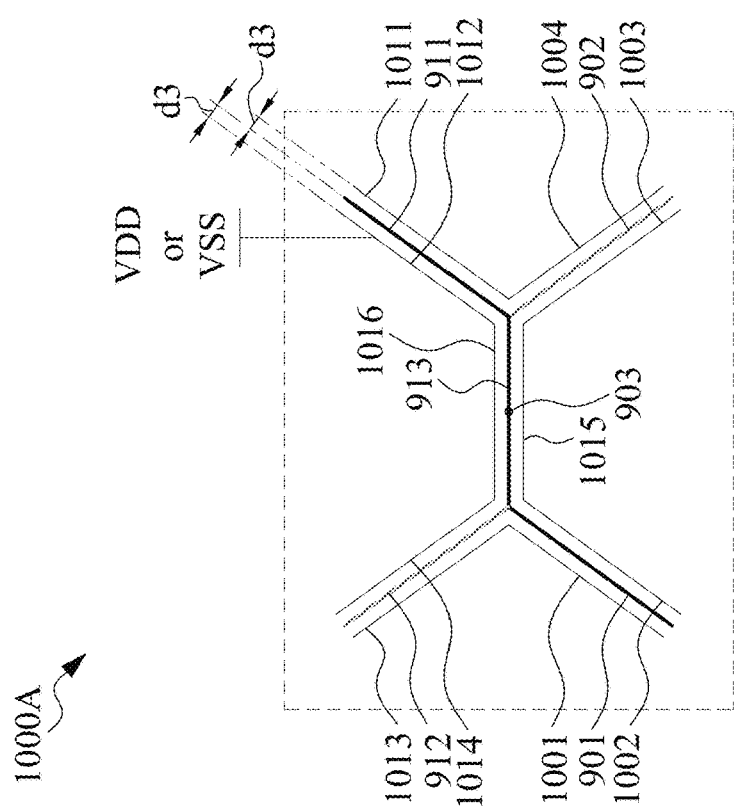
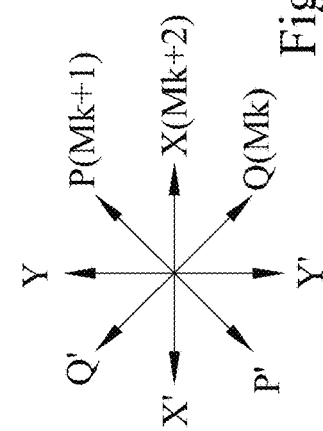
Fig. 10B

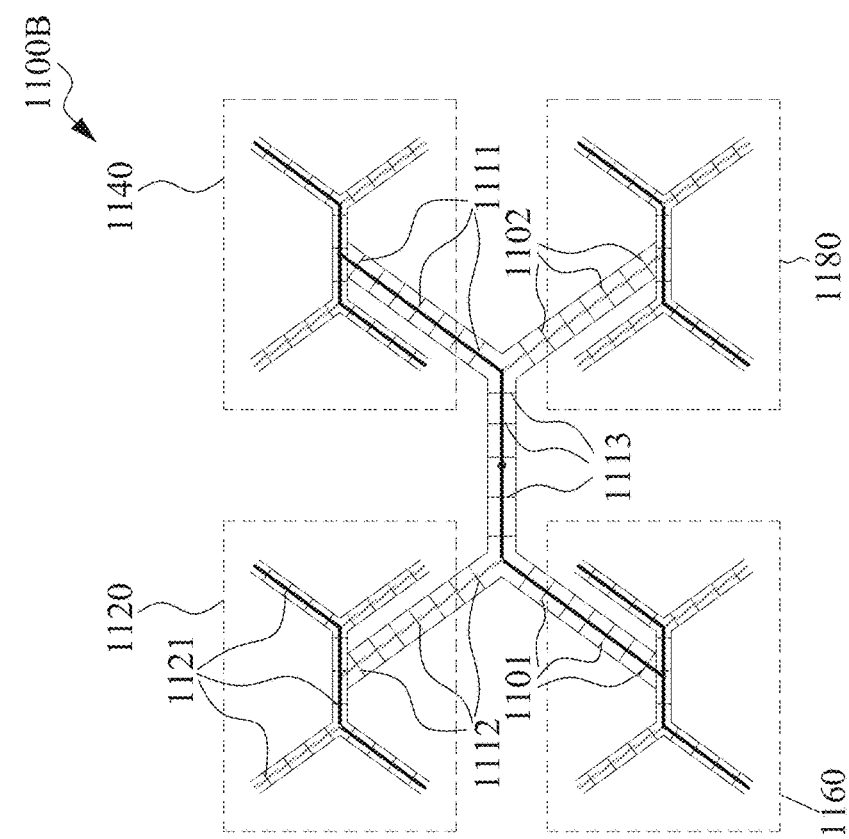
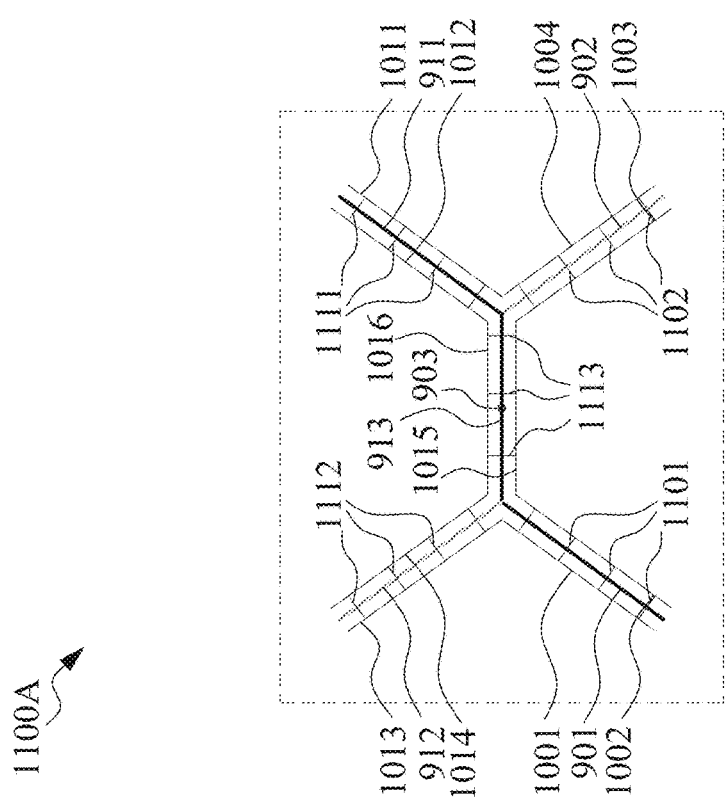
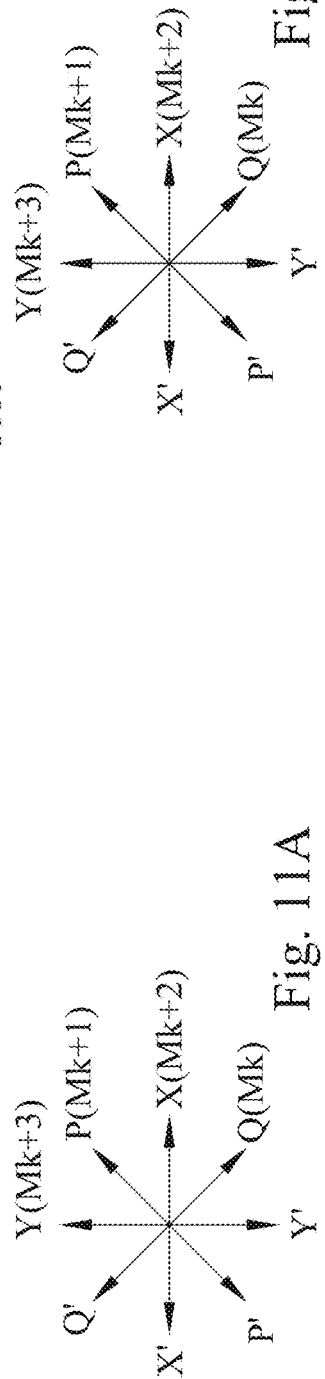
Fig. 11A
Fig. 11B

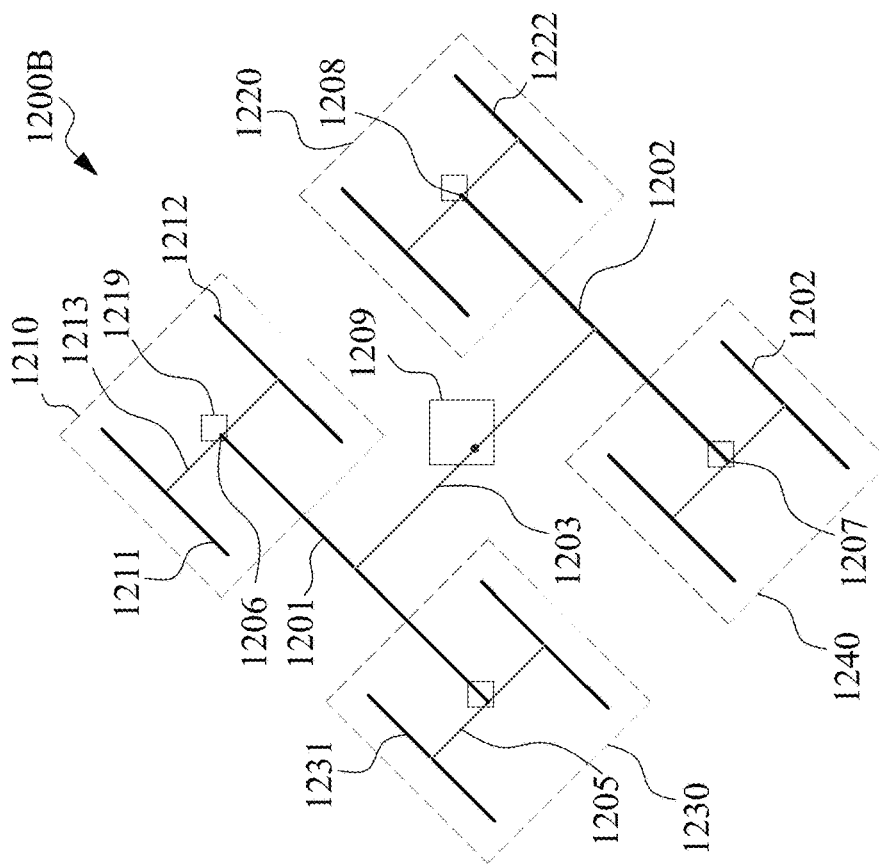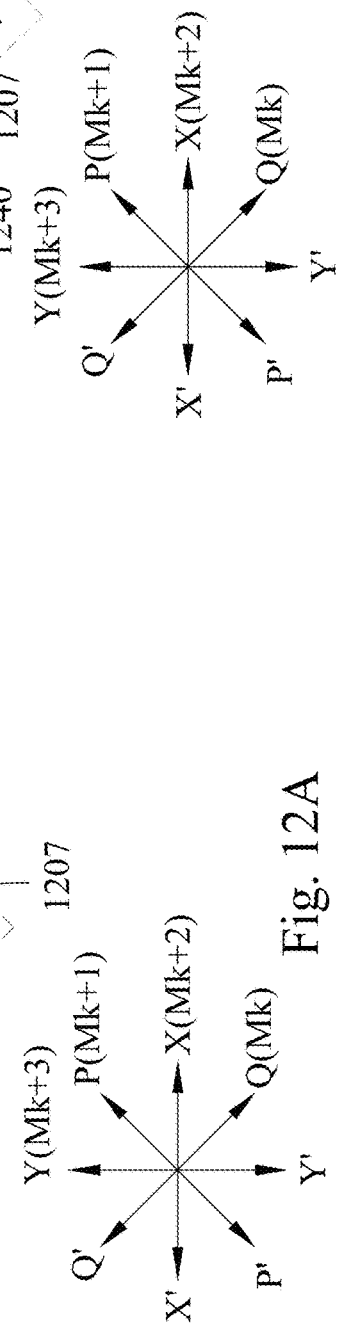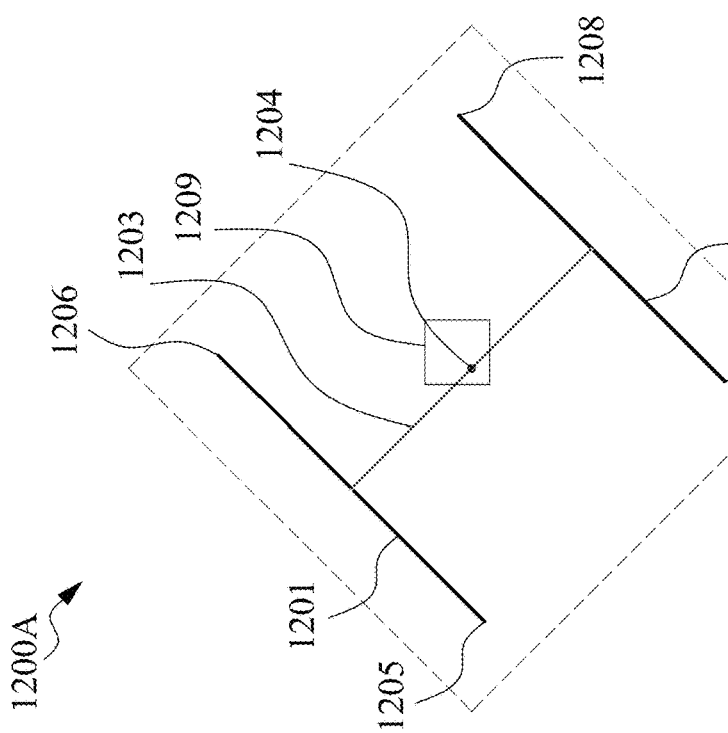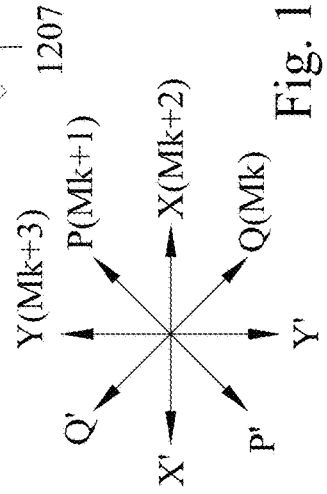
Fig. 12B
Fig. 12A

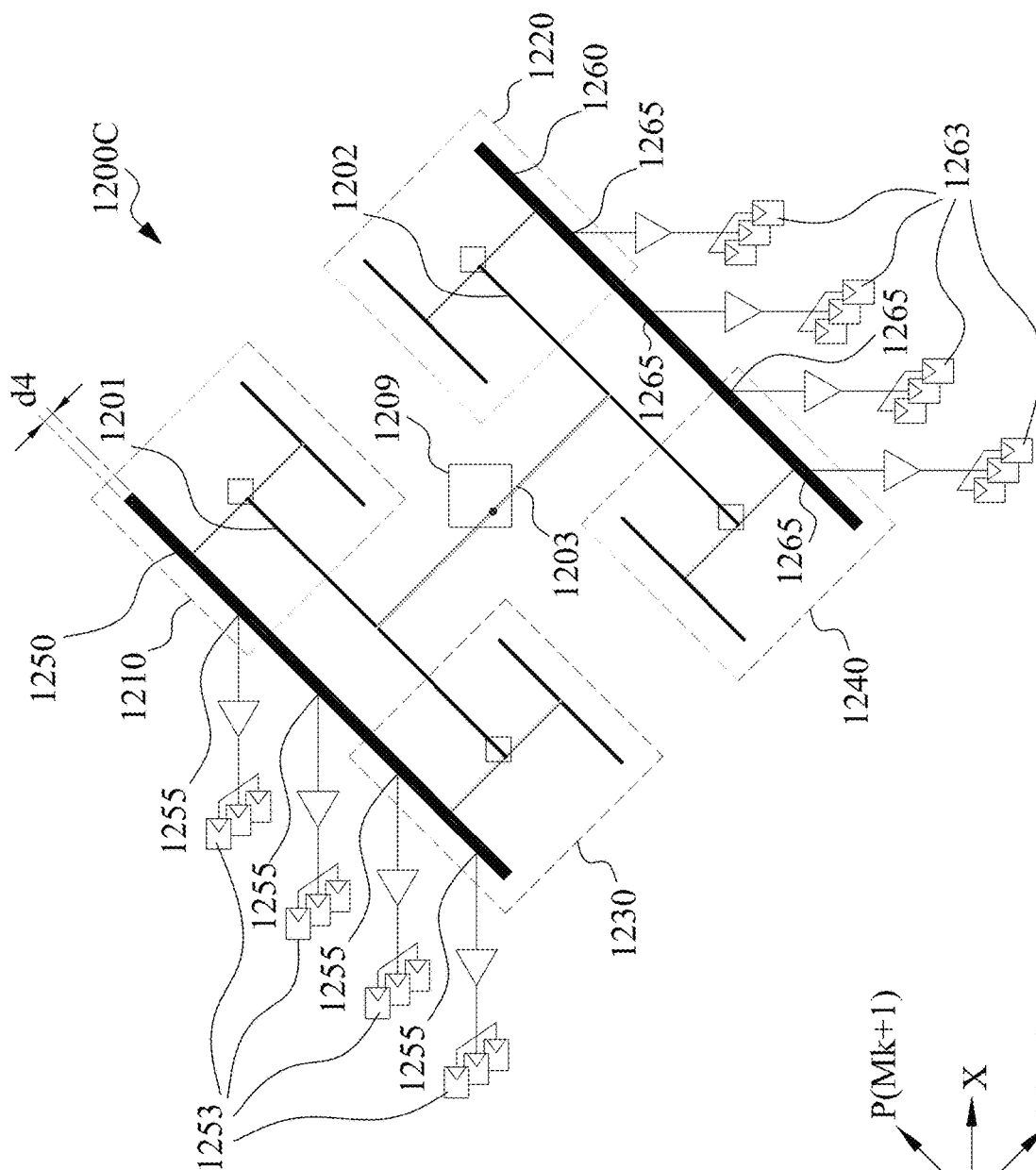
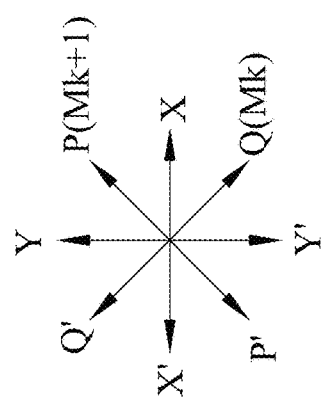
Fig. 12C

CLOCK SIGNAL DISTRIBUTION SYSTEM, INTEGRATED CIRCUIT DEVICE AND METHOD

BACKGROUND

Integrated circuit (IC) devices have grown in complexity, and often operate at increased clock frequencies with lowered power consumption and/or voltage. Providing accurate clock signals in such IC devices is a design concern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2B-2E are schematic sectional views of various portions of an IC device, in accordance with some embodiments.

FIGS. 8A-8B, 9A-9B, 10A-10B, 11A-11B, 12A-12C are schematic views of layouts of various clock trees, in accordance with some embodiments.

DETAILED DESCRIPTION

Figure 1:
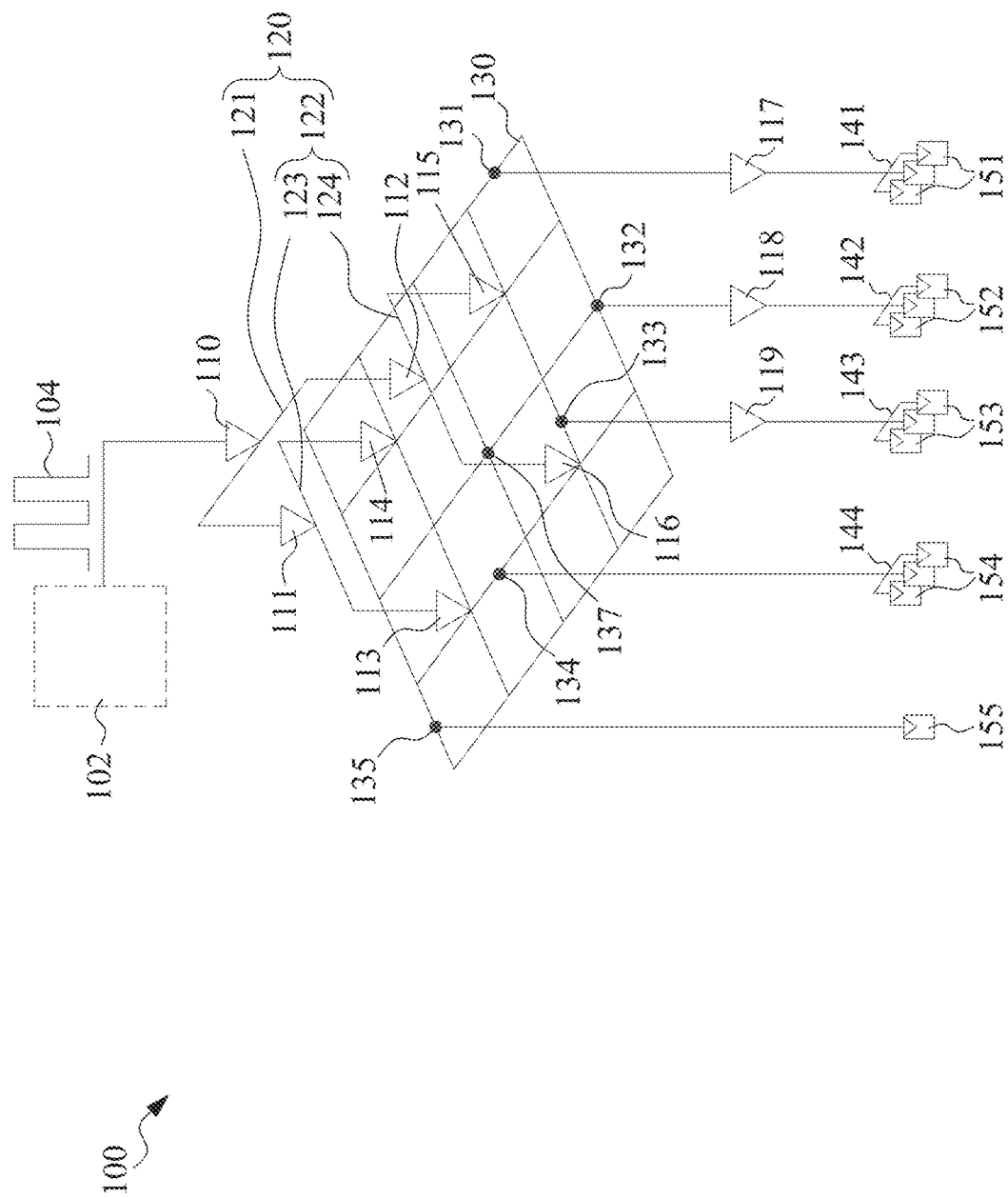
FIG. 1 is a schematic diagram of a clock distribution system for an IC device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An IC device comprises active regions and gate regions which together form various elements for circuitry of the IC device. The active regions extend along a first axis, and the gate regions extend along a second axis transverse to the first axis. Metal layers over the active regions and the gate regions include metal patterns for routing various signals to and from the circuitry of the IC device. Example signals include, but are not limited to, power, control, data, clock, or the like. In some embodiments, metal patterns for distributing clock signals, also referred to herein as clock metal patterns, are slanted or oblique to both the first axis and the second axis. As a result, in at least one embodiment, at least one of clock latency, clock power consumption, or clock path is reduced compared to other approaches with no slanted clock metal patterns. In one or more embodiments, one or more shielding metal patterns are coupled to a power supply voltage and arranged alongside, over or under a clock metal pattern. As a result, in at least one embodiment, interference between a clock signal distributed along the clock metal pattern and other signals is preventable or reduced.

FIG. 1 is a schematic diagram of a clock distribution system 100 for an IC device, in accordance with some embodiments.

The clock distribution system 100 is configured to receive a clock signal 104 from a clock source 102, and to distribute the clock signal 104 to various circuitry in the IC device. The clock distribution system 100 comprises a plurality of clock drivers 110-119 arranged at various locations in the clock distribution system 100, a pre-mesh clock tree 120, a clock mesh structure 130, and a plurality of post-mesh clock trees 141-144. A plurality of clock loads or clock sinks 151-155 are electrically coupled to the clock distribution system 100 to receive clock signals distributed therefrom.

In some embodiments, the clock source 102 comprises one or more of an oscillator circuit, a phase-locked loop (PLL) circuit, a clock divider circuit, or the like. Other clock source configurations are within the scopes of various embodiments. In at least one embodiment, the clock source 102 is an internal clock source included in the IC device that comprises the clock distribution system 100. In at least one embodiment, the clock source 102 is an external clock source arranged outside the IC device, and is electrically coupled to the IC device, e.g., via one or more input/output (IO) pins of the IC device. Other configurations of the clock source 102 are within the scopes of various embodiments.

In some embodiments, each of the clock drivers 110-119 comprises one or more of a buffer, an inverter, an amplifier, a logic gate, or the like. Other clock driver configurations are within the scopes of various embodiments. The arrangement of the clock drivers 110-119 in the clock distribution system 100 as illustrated in FIG. 1 is an example. Other configurations are within the scopes of various embodiments. For example, one or more of the clock drivers 110-119 is/are omitted and/or one or more further clock drivers is/are added, in accordance with some embodiments.

In the example configuration in FIG. 1, the pre-mesh clock tree 120 comprises an upper tier 121 and a lower tier 122. The upper tier 121 comprises a metal pattern sometimes referred to as a trunk of the pre-mesh clock tree 120, and is electrically coupled to an output of the clock driver 110. The clock driver 110 further has an input electrically coupled to the clock source 102 to receive the clock signal 104, and is configured to deliver the clock signal 104 to the pre-mesh clock tree 120. Opposite ends of the metal pattern of the upper tier 121 are electrically coupled to inputs of the clock drivers 111-112. The lower tier 122 comprises metal patterns 123, 124 which are sometimes referred to as branches of the pre-mesh clock tree 120, and are electrically coupled correspondingly to outputs of the clock drivers 111-112. Opposite ends of the metal pattern 123 are electrically coupled to inputs of the clock drivers 113-114. Opposite ends of the metal pattern 124 are electrically coupled to inputs of the clock drivers 115-116. The example configuration of the pre-mesh clock tree 120 in FIG. 1 is an H-tree. Other clock tree configurations are within the scopes of various embodiments, as described herein. For example, in one or more embodiments, the clock mesh structure 130 comprises one tier, or more than two tiers. In at least one embodiment, the pre-mesh clock tree 120 is omitted.

The clock mesh structure 130 is electrically coupled to outputs of the clock drivers 113-116. The clock mesh structure 130 comprises a plurality of metal patterns arranged in one or more metal layers and all electrically coupled to each other to short the outputs of the clock drivers 113-116. As a result, the same clock signal, or substantially the same clock signal, is retrievable at any point on the clock mesh structure 130. The clock mesh structure 130 comprises a plurality of tap points from which the clock signal is obtained to be delivered to clock loads in the circuitry of the IC device. In the example configuration in FIG. 1, five tap points 131-135 are indicated for illustrative purposes. An actual number and/or location of tap points on the clock mesh structure 130 depend on how clock loads are distributed in the circuit of the IC device. The configuration of the clock mesh structure 130 with two sets of parallel wirings in FIG. 1 is an example, and is sometimes referred to as the "Manhattan" configuration. Other clock mesh structure configurations are within the scopes of various embodiments, as described herein. In at least one embodiment, the clock mesh structure 130 is omitted.

The post-mesh clock trees 141-144 are electrically coupled to the clock mesh structure 130 at the corresponding tap points 131-134. The post-mesh clock trees 141-143 are electrically coupled to the corresponding tap points 131-133 through the corresponding clock drivers 117-119, and are configured to deliver the clock signal to corresponding clock loads 151-153. The post-mesh clock tree 144 is electrically coupled to the corresponding tap point 144 directly without a clock driver in between, and is configured to deliver the clock signal to corresponding clock load 154. A clock load 155 is electrically coupled to the tap point 145 directly, without a clock driver or a post-mesh clock tree in between. In some embodiments, each of the clock loads 151-155 comprises a flip-flop, or the like. Other clock load configurations are within the scopes of various embodiments. In at least one embodiment, one or more or all of the post-mesh clock trees 141-143 is/are omitted.

The configuration of the clock distribution system 100 in FIG. 1 is an example. Other clock distribution system configurations are within the scopes of various embodiments. For example, in one or more embodiments, the pre-mesh clock tree 120 is omitted and the output of the clock driver 110 is electrically coupled to a center point 137 of the clock mesh structure 130. In at least one embodiment, the clock mesh structure 130 is omitted and at least one metal pattern of the pre-mesh clock tree 120 is configured as a clock spine to which the clock loads are electrically coupled. In at least one embodiment, the clock distribution system 100 comprises the clock mesh structure 130, and has no clock trees. In one or more embodiments, the clock distribution system 100 comprises one or more of the clock trees 120, 141-144, and has no clock mesh structure.

In some embodiments, a layout of the clock distribution system 100 is generated in a clock tree synthesis (CTS) operation performed by, e.g., an electronic design automation (EDA) tool, such as an automatic placement and routing (APR) tool.

Figure 2A:
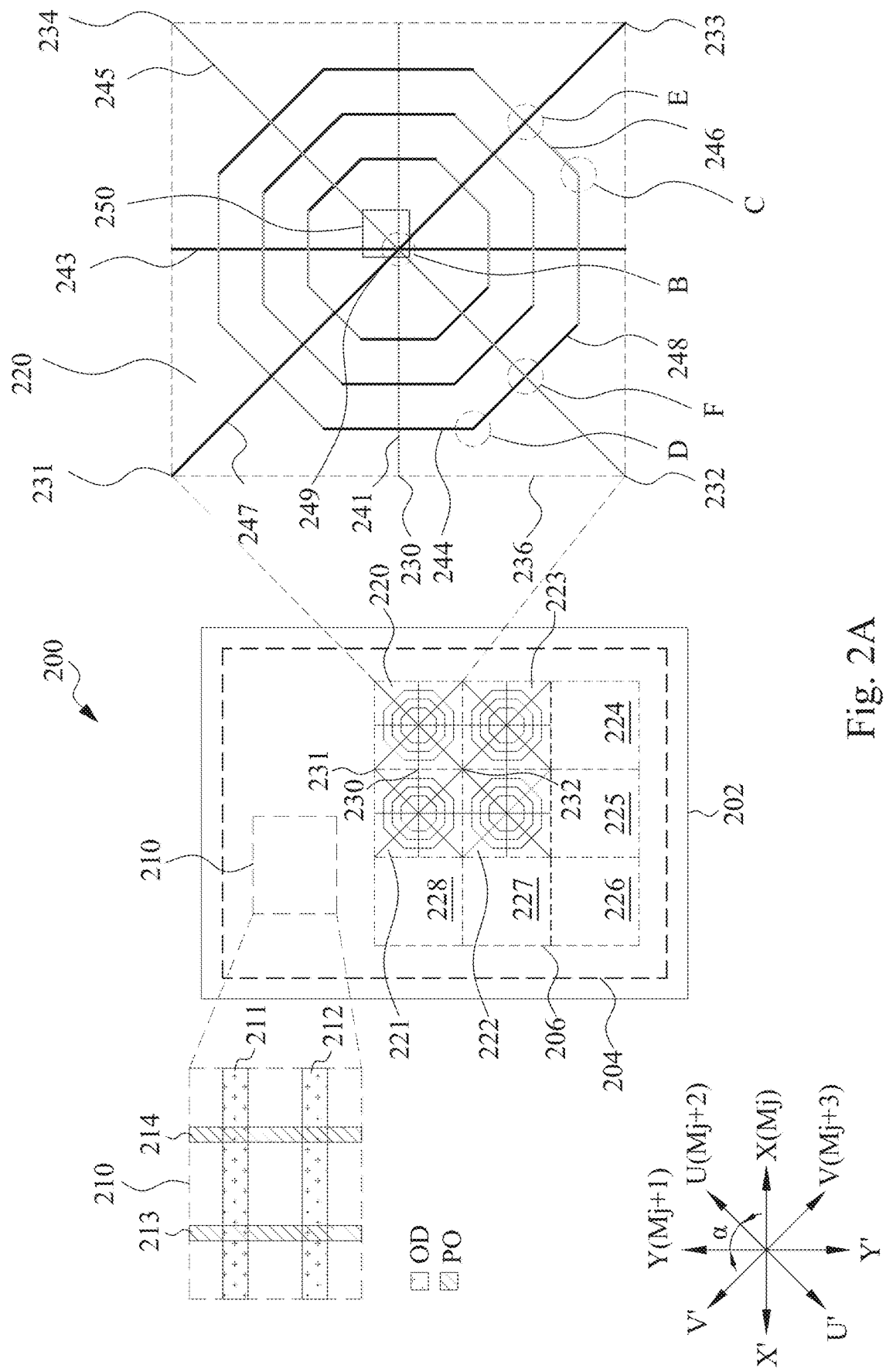
FIG. 2A is a schematic view of a layout of an IC device, in accordance with some embodiments.

FIG. 2A is a schematic view of a layout of an IC device 200, in accordance with some embodiments. In at least one embodiment, the IC device 200 corresponds to an IC device comprising the clock distribution system 100.

The IC device 200 comprises a substrate 202, a circuit region 204 over the substrate 202, and a clock mesh structure 206 over and electrically coupled to the circuit region 204.

In some embodiments, the substrate 202 is a semiconductor material (e.g., silicon, doped silicon, GaAs, or another semiconductor material). In some embodiments, the substrate 202 is a P-doped substrate. In some embodiments, the substrate 202 is an N-doped substrate. In some embodiments, the substrate 202 is a rigid crystalline material other than a semiconductor material (e.g., diamond, sapphire, aluminum oxide ($Al_2O_3$), or the like) on which an IC is manufactured. In some embodiments, N-type and P-type dopants are added to the substrate 202 to form one or more circuit elements as described herein.

The circuit region 204 comprises at least one cell. Each cell represents one or more semiconductor structures configured to perform a specific function. Cells having predesigned layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for IC devices. Each cell includes one or more circuit elements and/or one or more nets. A circuit element is an active element or a passive element. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. Examples of passive elements include, but are not limited to, capacitors, inductors, fuses, resistors, or the like. Examples of nets include, but are not limited to, vias, conductive pads, conductive traces (also referred to herein as "patterns"), and conductive redistribution layers, or the like. In some embodiments, the circuit region 204 comprises a combination of cells electrically coupled together to perform various functions of the IC device 200. Examples of cells include, but are not limited to, inverters, adders, multipliers, logic gates (such as NAND, XOR, NOR or the like), phase lock loops (PLLs), flip-flops, multiplexers, or the like.

The circuit region 204 comprises at least one active region extending along a first axis, and at least one gate region extending across the at least one active region and along a second axis transverse to the first axis. For example, as shown in the enlarged view of an example section 210 of the circuit region 204 in FIG. 2A, the circuit region 204 comprises active regions 211, 212 and gate regions 213, 214. The active regions 211, 212 extend, or are elongated, along an X-X' axis, which is the first axis. The gate regions 213, 214 extend, or are elongated, across the active regions 211, 212 and along a Y-Y' axis, which is the second axis. The Y-Y' axis is transverse to the X-X' axis. In at least one embodiment, the Y-Y' axis is perpendicular to the X-X' axis. Active regions are sometimes referred to as oxide-definition (OD) regions, and are schematically illustrated in the drawings with the label "OD." The X-X' axis is sometimes referred to as the OD axis. The active regions 211, 212 include P-type dopants and/or N-type dopants. The gate regions 213, 214 include a conductive material, such as, polysilicon, and is schematically illustrated in the drawings with the label "PO." The Y-Y' axis is sometimes referred to as the Poly axis. Other conductive materials for the gate regions, such as metals, are within the scope of various embodiments.

The active regions 211, 212 and the gate regions 213, 214 together form one or more circuit elements (not shown). Although in the example configuration in FIG. 2A, the active regions 211, 212 and gate regions 213, 214 are shown inside the section 210, this is for illustrative purposes. In some embodiments, active regions and/or gate regions are arranged in other sections of the circuit region 204. In at least one embodiment, active regions and gate regions, and therefore corresponding circuit elements of the circuit region 204, are arranged over substantially an entirety of the circuit region 204. The circuit elements of the circuit region 204 are interconnected by nets (not shown) to form the circuitry of the IC device 200. In at least one embodiment, the circuit region 204 comprises clock loads corresponding to the clock loads 151-155 described with respect to FIG. 1. The nets of the IC device 200 comprise metal patterns in various metal layers arranged one on top another, and are electrically coupled by via structures. The lowermost metal layer immediately over the circuit region 204 is sometimes referred to as the metal-zero (M0) layer, the subsequent metal layer immediately over the M0 layer is sometimes referred to as the metal-one (M1) layer, and so on.

The clock mesh structure 206 comprises metal patterns which are electrically coupled with each other, are arranged in one or more of the metal layers over the circuit region 204, and are electrically coupled to the clock loads in the circuit region 204. The coverage of the clock mesh structure 206 over the circuit region 204 in FIG. 2A is an example. In at least one embodiment, the clock mesh structure 206 covers the entirety, or a substantial portion, of the circuit region 204. For example, the clock mesh structure 206 extends over the section 210 in one or more embodiments.

The clock mesh structure 206 comprises a plurality of polygonal regions (also referred to as "clock domains") 220-228 arranged in a repeating manner and abutting each other. Each of the polygonal regions 220-228 comprises a plurality of metal patterns coupled with each other. For example, metal patterns in the polygonal regions 220-223 are illustrated in FIG. 2A. For simplicity, metal patterns in the other polygonal regions are omitted. Each pair of adjacent polygonal regions among the polygonal regions 220-228 has metal patterns which are continuous, or overlap and are electrically coupled, to each other on a common boundary between the adjacent polygonal regions. For example, on the common boundary between the adjacent polygonal regions 220, 221, metal patterns of the polygonal region 220 overlap and are electrically coupled to corresponding metal patterns of the polygonal region 221 at corners 231, 232, and a metal pattern of the polygonal region 220 is continuous to a corresponding metal pattern of the polygonal region 221 at a midpoint 230. Further metal patterns of the polygonal regions 222, 223 also overlap and are electrically coupled to the corresponding metal patterns of the polygonal regions 220, 221 at the common corner 232. In at least one embodiment, the layout of the metal patterns in one or more of the polygonal regions 220-228 is a predetermined layout, e.g., a layout stored as a cell in a cell library, and is placed into a layout of the IC device 200 by an APR tool. In at least one embodiment, the layout of the metal patterns in one or more of the polygonal regions 220-228 is generated by an APR tool based on specifics of the circuitry of the IC device 200.

The configuration of the clock mesh structure 206 in FIG. 2A is an example. Other clock mesh structure configurations are within the scopes of various embodiments. For example, although the clock mesh structure 206 in FIG. 2A comprises nine polygonal regions 220-228, other numbers and/or arrangements of polygonal regions inside the clock mesh structure 206 are within the scopes of various embodiments. For another example, the polygonal regions 220-228 in FIG. 2A are identical, having the same shape (e.g., square) and the same layout of metal patterns. However, in some embodiments, one or more of polygonal regions of the clock mesh structure 206 has/have a shape and/or a layout of metal patterns other than the other polygonal regions. In some embodiments, one or more of the polygonal regions of the clock mesh structure 206 has/have a shape and/or a layout of metal patterns different from the square shape and/or the layout of metal patterns illustrated in FIG. 2A. Example shapes of polygonal regions in the clock mesh structure 206 include, but are not limited to, square, rectangle, hexagon, or any other tessellable polygons.

In some embodiments, each of the polygonal regions 220-228 comprises at least one metal pattern which is oblique to both the X-X' axis and the Y-Y' axis, for example, as illustrated in the enlarged view of the polygonal region 220 in FIG. 2A. Inside the polygonal region 220, the clock mesh structure 206 comprises metal patterns extending along the X-X' axis, the Y-Y' axis, a U-U' axis and a V-V' axis. For example, metal patterns 241, 242 are examples of metal patterns which extend along the X-X' axis and are referred to herein as X-axis metal patterns. Metal patterns 243, 244 are examples of metal patterns which extend along the Y-Y' axis and are referred to herein as Y-axis metal patterns. Metal patterns 245, 246 are examples of metal patterns which extend along the U-U' axis and are referred to herein as U-axis metal patterns. Metal patterns 247, 248 are examples of metal patterns which extend along the V-V' axis and are referred to herein as V-axis metal patterns. The U-axis metal patterns, the V-axis metal patterns, the U-U' axis, and the V-V' axis are oblique to both the X-X' axis and the Y-Y' axis. Further, the U-U' axis is transverse to the V-V' axis. In one or more embodiments, the U-U' axis is perpendicular to the V-V' axis. In at least one embodiment, the U-U' axis is oblique, i.e., not perpendicular, to the V-V' axis.

The U-U' axis forms with either of the X-X' axis or the Y-Y' axis an acute angle. For example, as illustrated in FIG. 2A, an angle α between the U-U' axis and the Y-Y' axis is an acute angle. The acute angle may be between any one of orientations U, U' and any one of orientations Y, Y'. Similarly, the U-U' axis and the X-X' axis form therebetween an acute angle which may be between any one of orientations U, U' and any one of orientations X, X'. The V-V' axis also forms with either of the X-X' axis or the Y-Y' axis an acute angle. For example, the V-V' axis and the X-X' axis form therebetween an acute angle which may be between any one of orientations V, V' and any one of orientations X, X'. Similarly, the U-U' axis and the Y-Y' axis form therebetween an acute angle which may be between any one of orientations U, U' and any one of orientations Y, Y'. Any of the described acute angles, e.g., the angle α, is greater than 0 degrees, and is smaller than 90 degrees. In some embodiments, the acute angle α is between 10 degrees and 80 degrees, or between 20 degrees and 70 degrees, or between 30 degrees and 60 degrees, or between 40 degrees and 50 degrees. In some embodiments, to achieve a smallest possible clock latency, the acute angle α is selected such that a clock trunk (also referred to herein as "trunk") extends from a center of a clock domain to an edge or a corner of the clock domain in a straight line. The center of a clock domain is where a clock driver is electrically coupled to metal patterns in the clock domain, and metal patterns electrically coupled to the clock driver at the center are clock trunks. For example, as described herein, the polygonal region (or clock domain) 220 has a center 249 to which a clock driver 250 is electrically coupled, and the metal patterns 241, 243, 245, 247 electrically coupled to the clock driver 250 at the center 249 are clock trunks. In the example configuration in FIG. 2A, the clock domain 220 is a square and the U-U' axis and the V-V' axis form with the X-X' axis and Y-Y' axis 45 degree angles, such that each of the clock trunks 241, 243, 245, 247 extends from the center 249 of the clock domain 220 to an edge or a corner of the clock domain 220 in a straight line. In a further example configuration (not shown), the clock domain 220 is a rectangle with a 2:1 ratio between its height (along the Y-Y' axis) and width (along the X-X' axis), and the angle α is about 26.6 degrees such that each of the clock trunks 241, 243, 245, 247 extends from the center 249 of the clock domain 220 to an edge or a corner of the clock domain 220 in a straight line. The described layout with metal pattern extending in four directions, i.e., along the X-X' axis, Y-Y' axis, U-U' axis, V-V' axis, is an example. Other configurations are within the scopes of various embodiments. For example, in some embodiments, the layout of the clock mesh structure 206 comprises metal patterns along two directions, or three directions, or more than four directions.

In some embodiments, metal patterns extending along different axes are formed in different metal layers. For example, the X-axis metal patterns are formed in a metal layer Mj, the Y-axis metal patterns are formed in a metal layer Mj+1 which is the metal layer immediately above the metal layer Mj, the U-axis metal patterns are formed in a metal layer Mj+2 which is the metal layer immediately above the metal layer Mj+1, and the V-axis metal patterns are formed in a metal layer Mj+3 which is the metal layer immediately above the metal layer Mj+2. The metal layer Mj is any metal layer above the M1 layer. The described order of the X-axis metal patterns, the Y-axis metal patterns, the U-axis metal patterns, the V-axis metal patterns being correspondingly in lower to higher metal layers is an example. Other orders of metal layers containing the X-axis metal patterns, the Y-axis metal patterns, the U-axis metal patterns, the V-axis metal patterns are within the scopes of various embodiments. Further, the metal layers Mj, Mj+1, Mj+2, Mj+3 are consecutive metal layers in the described arrangement. However, in one or more embodiments, the metal patterns of the clock mesh structure 206 are arranged in non-consecutive metal layers.

In some embodiments, all metal patterns in a metal layer are linear and parallel to each other. For example, all metal patterns in the metal layer Mj, including metal patterns configured to carry non-clock signals such as power, data, control, or the like, extend along the X-X' axis like the X-axis metal patterns 241, 242. For another example, all metal patterns in the metal layer Mj+1, including metal patterns configured to carry non-clock signals, extend along the Y-Y' axis like the Y-Y' axis metal patterns 243, 244. In some embodiments, depending one various factors such as manufacturing processes, IC complexity, IC design constraints, or the like, it is possible to form metal patterns having different orientations in the same metal layer. For example, in one or more embodiments, the X-axis metal patterns and the U-axis metal patterns are formed in a metal layer, and/or the Y-axis metal patterns and the V-axis metal patterns are formed in another metal layer.

The X-axis metal pattern 241, the Y-axis metal pattern 243, the U-axis metal pattern 245 and the V-axis metal pattern 247 overlap at a center 249 of the polygonal region 220, and are electrically coupled to each other by via structures as described with respect to FIG. 2B. A clock driver 250 has an output electrically coupled to the X-axis metal pattern 241, the Y-axis metal pattern 243, the U-axis metal pattern 245 and the V-axis metal pattern 247 at the center 249. In at least one embodiment, the clock driver 250 corresponds to at least one of the clock drivers 113-116 described with respect to FIG. 1. In at least one embodiment, a clock driver corresponding to the clock driver 250 is included in each of the other polygonal regions 221-228 of the clock mesh structure 206, but is not illustrated for simplicity. In the example configuration in FIG. 2A, the center 249 is a symmetrical center of the polygonal region 220, i.e., the layout of the metal patterns in the polygonal region 220 is symmetric about the center 249. Other configurations are within the scopes of various embodiments. Besides the center 249, the metal patterns in the polygonal region 220 further overlap each other at various overlapping points where the overlapping metal patterns are electrically coupled to each other by via structures, as described with respect to FIGS. 2C-2E.

The X-axis metal pattern 241, the Y-axis metal pattern 243, the U-axis metal pattern 245 and the V-axis metal pattern 247 electrically coupled to receive the clock signal from the clock driver 250 are referred to herein as main metal patterns, or trunk. Other metal patterns in the polygonal region 220 branch out from the main metal patterns 241, 243, 245, 247 to deliver the clock signal to various tap points over the circuitry in the circuit region 204. In the example configuration in FIG. 2A, all metal patterns branching out from a main metal pattern, or trunk, extend perpendicular to the main metal pattern. For example, all Y-axis metal patterns branching out from the X-axis metal pattern 241, which is a main metal pattern, overlap the X-axis metal pattern 241 and are electrically coupled to the X-axis metal pattern 241 at corresponding overlapping points. All X-axis metal patterns branching out from the Y-axis metal pattern 243, which is a main metal pattern, overlap the Y-axis metal pattern 243 and are electrically coupled to the Y-axis metal pattern 243 at corresponding overlapping points. All V-axis metal patterns branching out from the U-axis metal pattern 245, which is a main metal pattern, overlap the U-axis metal pattern 245 and are electrically coupled to the U-axis metal pattern 245 at corresponding overlapping points. All U-axis metal patterns branching out from the V-axis metal pattern 247, which is a main metal pattern, overlap the V-axis metal pattern 247 and are electrically coupled to the V-axis metal pattern 247 at corresponding overlapping points.

In the example configuration in FIG. 2A, the metal patterns other than the main metal patterns 241, 243, 245, 247 in the polygonal region 220 form three concentric polygons, e.g., octagons, having the common center 249. The concentric polygons are arranged at a regular interval radially outwardly from the center 249. The described number of concentric polygons and/or the described shape of the concentric polygons are examples. Other configurations are within the scopes of various embodiments. For example, in at least one embodiment, it is possible to adjust the size of the polygonal region 220 and/or the number of the concentric polygons formed by the metal patterns in the polygonal region 220, so that the polygonal region 220 alone is sufficient to provide clock signals to the circuit region 204. In other words, the polygonal region 220 is the clock mesh structure 206, in one or more embodiments.

In FIG. 2A, for each corner of the polygonal region 220, at least one metal layer in the polygonal region 220 extends from inside the polygonal region 220 to the corner. For example, the V-axis metal pattern 247 extends from the center 249 to corners 231, 233 of the polygonal region 220, and the U-axis metal pattern 245 extends from the center 249 to corners 232, 234 of the polygonal region 220. Further, for each side of the polygonal region 220, at least one metal layer in the polygonal region 220 extends from inside the polygonal region 220 to a midpoint of the side. For example, the X-axis metal pattern 241 extends from the center 249 to the midpoint 230 of a side 236 connecting the corners 231, 232. The V-axis metal pattern 247 and the U-axis metal pattern 245 overlap and are electrically coupled to corresponding metal patterns of the polygonal region 221 at the corresponding corners 231, 232, whereas the X-axis metal pattern 241 is continuous to a corresponding X-axis metal pattern of the polygonal region 221 at the midpoint 230, as described herein. As a result, metal patterns in the polygonal regions of the clock mesh structure 206 are all electrically coupled together.

In some embodiments, the clock mesh structure 206 makes it possible to achieve reductions in at least one of clock path, clock latency or clock consumption power. A clock path is a total length of electrically coupled metal patterns from where a clock signal is input to the clock mesh structure 206 to a tap point where the clock signal is extracted from the clock mesh structure 206. For example, for a tap point at the corner 231, the clock path is the length of the V-axis metal pattern 247 from the center 249 to the corner 231. In other approaches with no slanted clock metal patterns, i.e., without an oblique metal pattern corresponding to the V-axis metal pattern 247, the clock path for a tap point at the corner 231 is often a total of a distance along the X-X' axis from the center 249 to the midpoint 230 plus a distance along the Y-Y' axis from the midpoint 230 to the corner 231. As a result, clock paths, especially for tap points in corner regions, in the clock mesh structure 206 in accordance with some embodiments are shorter than in the other approaches. The shortened clock paths result in corresponding reductions in clock latency and/or clock consumption power, in one or more embodiments.

FIG. 2B is a schematic sectional view of a portion B of the IC device 200 in FIG. 2A, in accordance with some embodiments. The portion B includes the center 249 where the main metal patterns 241, 243, 245, 247 overlap and are electrically coupled to each other.

In the sectional view in FIG. 2B, N-type and P-type dopants are added to the substrate 202 to correspondingly form N wells 251, 252, and P wells (not shown). In some embodiments, isolation structures are formed between adjacent P wells and N wells. For simplicity, several features such as P wells and isolation structures are omitted from FIG. 2B. The N wells 251, 252 define source/drain regions of a transistor T. The N wells 251, 252 are referred to herein as source/drain regions 251, 252. A gate region of the transistor T comprises a stack of gate dielectric layers 253, 254, and a gate electrode 255. In at least one embodiment, the transistor T comprises a gate dielectric layer instead of multiple gate dielectrics. Example materials of the gate dielectric layer or layers include $HfO_2$, $ZrO_2$, or the like. Example materials of the gate electrode 255 include polysilicon, metal, or the like. The transistor T is an example of a circuit element in the circuitry of the IC device 200 that receives the clock signal delivered through the clock mesh structure 206. Contact structures for electrically coupling the transistor T to other circuit elements in the circuitry of the IC device 200 comprise metal-to-device (MD) regions 256, 257 correspondingly over and in electrical contact with the source/drain regions 251, 252, and a via structure (not shown) over and in electrical contact with the gate electrode 255. Further via-to-device (VD) via structures 258, 259 are correspondingly over and in electrical contact with the MD regions 256, 257. An interconnect structure 260 is over the VD via structures 258, 259, and comprises a plurality of metal layers M0, M1, . . . and a plurality of via layers V0, V1, . . . arranged alternatingly in a thickness direction of the substrate 202, i.e., along a Z-Z' axis. The interconnect structure 260 further comprises various interlayer dielectric (ILD) layers (not shown) in which the metal layers and via layers are embedded. The metal layers and via layers of the interconnect structure 260 are configured to electrically couple various elements or circuits of the IC device 200 with each other, and with external circuitry.

The metal layers Mj, Mj+1, Mj+2, Mj+3 containing the metal patterns of the clock mesh structure 206 are metal layers in the interconnect structure 260. As illustrated in FIG. 2B, the X-axis metal pattern 241 in the metal layer Mj is electrically coupled to the transistor T by a via structure 261 in a via layer Vj−1, and is electrically coupled to the Y-axis metal pattern 243 in the metal layer Mj+1 by a via structure 262 in a via layer Vj. The Y-axis metal pattern 243 is electrically coupled to the U-axis metal pattern 245 in the metal layer Mj+2 by a via structure 263 in a via layer Vj+1. The U-axis metal pattern 245 is electrically coupled to the V-axis metal pattern 247 in the metal layer Mj+3 by a via structure 264 in a via layer Vj+2. In some embodiments, the interconnect structure 260 comprises further layers and/or structures over the metal layer Mj+3. The described arrangement is an example. Other configurations are within the scopes of various embodiments.

FIG. 2C is a schematic sectional view of a portion C of the IC device 200 in FIG. 2A, in accordance with some embodiments. The portion C includes an overlapping point where the X-axis metal pattern 242 and the U-axis metal pattern 246 overlap and are electrically coupled to each other. In FIG. 2C, the X-axis metal pattern 242 on the metal layer Mj is electrically coupled to the U-axis metal pattern 246 on the metal layer Mj+2 by a via structure 265. For simplicity, layers, structures and the substrate 202 below the metal layer Mj are omitted in FIG. 2C.

Figures 2D, 2E:
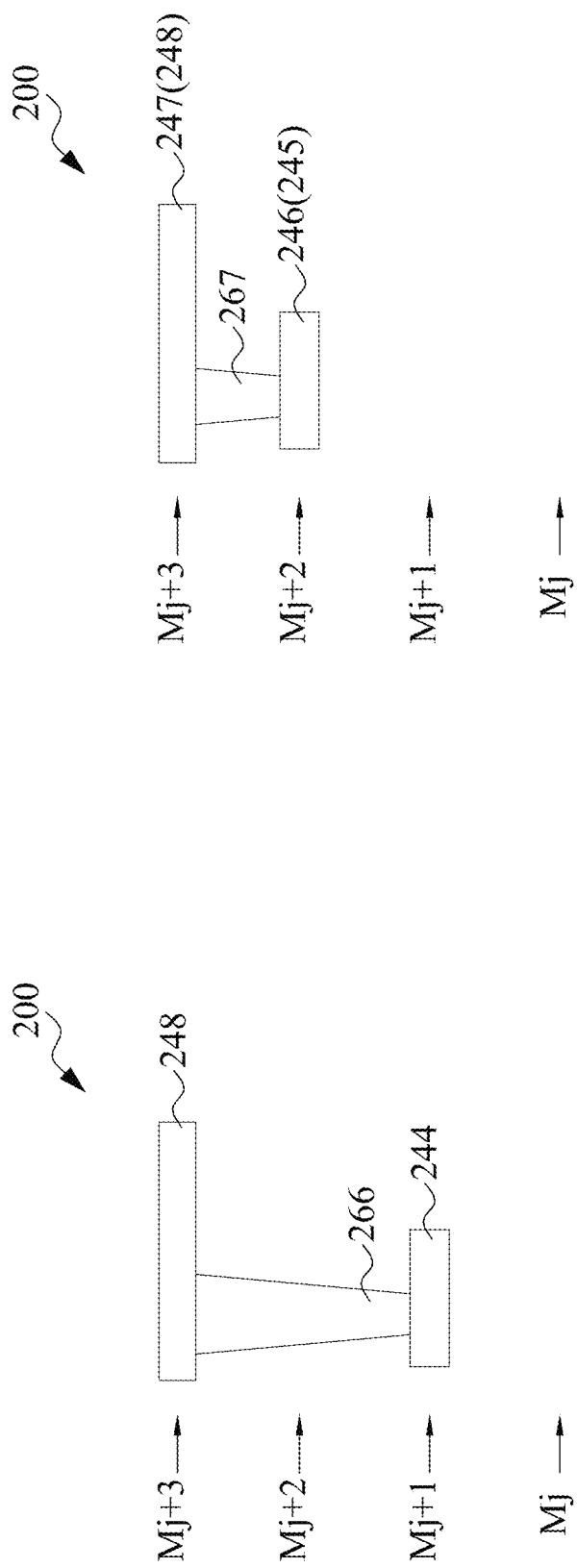

FIG. 2D is a schematic sectional view of a portion D of the IC device 200 in FIG. 2A, in accordance with some embodiments. The portion D includes an overlapping point where the Y-axis metal pattern 244 and the V-axis metal pattern 248 overlap and are electrically coupled to each other. In FIG. 2D, the Y-axis metal pattern 244 on the metal layer Mj+1 is electrically coupled to the V-axis metal pattern 248 on the metal layer Mj+3 by a via structure 266. For simplicity, layers, structures and the substrate 202 below the metal layer Mj are omitted in FIG. 2D.

FIG. 2E is a schematic sectional view of a portion E or a portion F of the IC device 200 in FIG. 2A, in accordance with some embodiments. The portion E includes an overlapping point where the U-axis metal pattern 246 and the V-axis metal pattern 247 overlap and are electrically coupled to each other. The portion F includes an overlapping point where the U-axis metal pattern 245 and the V-axis metal pattern 248 overlap and are electrically coupled to each other. In FIG. 2E, the U-axis metal pattern 245 or 246 on the metal layer Mj+2 is electrically coupled to the corresponding V-axis metal pattern 248 or 247 on the metal layer Mj+3 by a via structure 267. For simplicity, layers, structures and the substrate 202 below the metal layer Mj are omitted in FIG. 2E.

Figure 3:
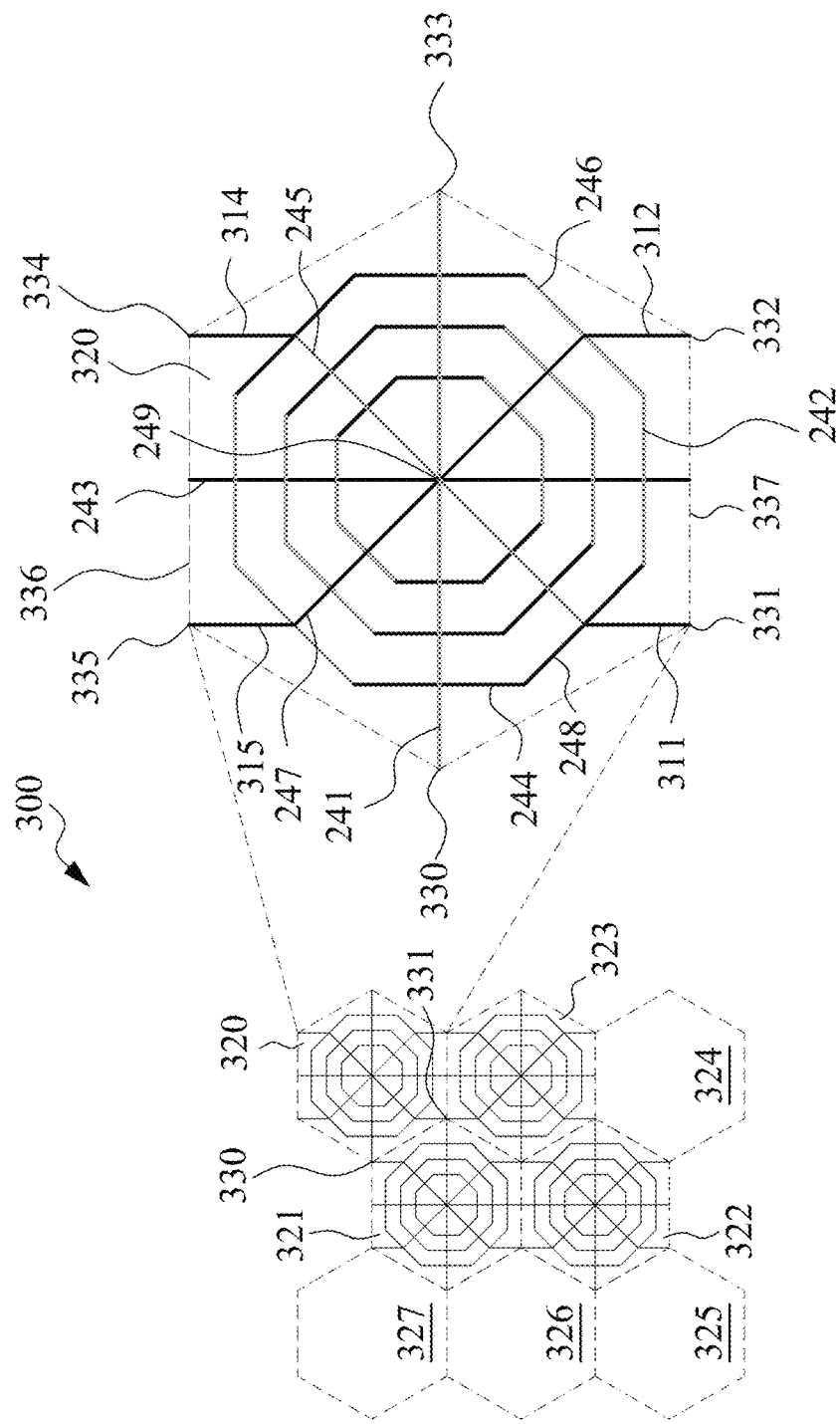
FIGS. 3-7 are schematic views of layouts of various clock mesh structures for IC devices, in accordance with some embodiments.

FIG. 3 is a schematic view of a layout of a clock mesh structure 300 for an IC device, in accordance with some embodiments. In at least one embodiment, the IC device comprising the clock mesh structure 300 corresponds to an IC device comprising the clock distribution system 100, or to the IC device 200. Components in FIG. 3 having corresponding components in FIG. 2A are designated by the same reference numerals, or by the reference numerals of FIG. 2A increased by 100. The clock mesh structure 300 is similar to the clock mesh structure 206, with one or more differences being described herein.

A difference between the clock mesh structure 300 and the clock mesh structure 206 includes the hexagonal shape of polygonal regions 320-327 of the clock mesh structure 300. The polygonal regions 320-327 are arranged in a repeating manner and abut each other. Metal patterns in the polygonal regions 320-323 are illustrated in FIG. 3. For simplicity, metal patterns in the other polygonal regions are omitted. In some embodiments, the polygonal regions 320-327 include clock drivers (not shown) which correspond to the clock driver 250. Each pair of adjacent polygonal regions among the polygonal regions 320-327 has metal patterns which are continuous, or overlap and are electrically coupled, to each other on a common boundary between the adjacent polygonal regions. For example, on the common boundary between the adjacent polygonal regions 320, 321, metal patterns of the polygonal region 320 overlap and are electrically coupled to corresponding metal patterns of the polygonal region 321 at corners 330, 331. In the example configuration in FIG. 3, the polygonal regions 320-327 are identical in both shape and layout of metal patterns. Other clock mesh structure configurations are within the scopes of various embodiments. For example, although the clock mesh structure 300 in FIG. 3 comprises eight polygonal regions 320-327, other numbers and/or arrangements of polygonal regions inside the clock mesh structure 300 are within the scopes of various embodiments. In at least one embodiment, the clock mesh structure 300 includes a single polygonal region, e.g., the polygonal region 320.

A further difference between the clock mesh structure 300 and the clock mesh structure 206 includes the addition of Y-axis metal patterns 311, 312, 314, 315, as illustrated in the enlarged view of the polygonal region 320 in FIG. 3. The polygonal region 320 is similar to the polygonal region 220 in that the polygonal region 320 also comprises main metal patterns 241, 243, 245, 247 overlapping at the center 249 and concentric polygons having the center 249 as a common center. The Y-axis metal pattern 311 extends from an end of the U-axis metal pattern 245 to a corner 331 of the hexagonal region 320, whereas the Y-axis metal pattern 314 extends from an opposite end of the U-axis metal pattern 245 to a corner 334 of the hexagonal region 320. The Y-axis metal pattern 312 extends from an end of the V-axis metal pattern 247 to a corner 332 of the hexagonal region 320, whereas the Y-axis metal pattern 315 extends from an opposite end of the V-axis metal pattern 247 to a corner 335 of the hexagonal region 320. The X-axis metal pattern 241 extends between corners 330, 333 of the hexagonal region 320. The Y-axis metal pattern 243 extends between opposite sides 336, 337 of the hexagonal region 320. The X-axis metal pattern 241, Y-axis metal patterns 243, 311, 312, 314, 315, which extend to the corresponding sides and corners of the hexagonal region 320, are electrically coupled to corresponding metal patterns of adjacent polygonal regions in the clock mesh structure 300. For example, the X-axis metal pattern 241 and the Y-axis metal pattern 311 are electrically coupled to the corresponding metal patterns of the adjacent polygonal region 321, at the corresponding corners 330, 331 as described herein. In at least one embodiment, one or more advantages described herein are achievable in an IC device having the clock mesh structure 300.

Figure 4:
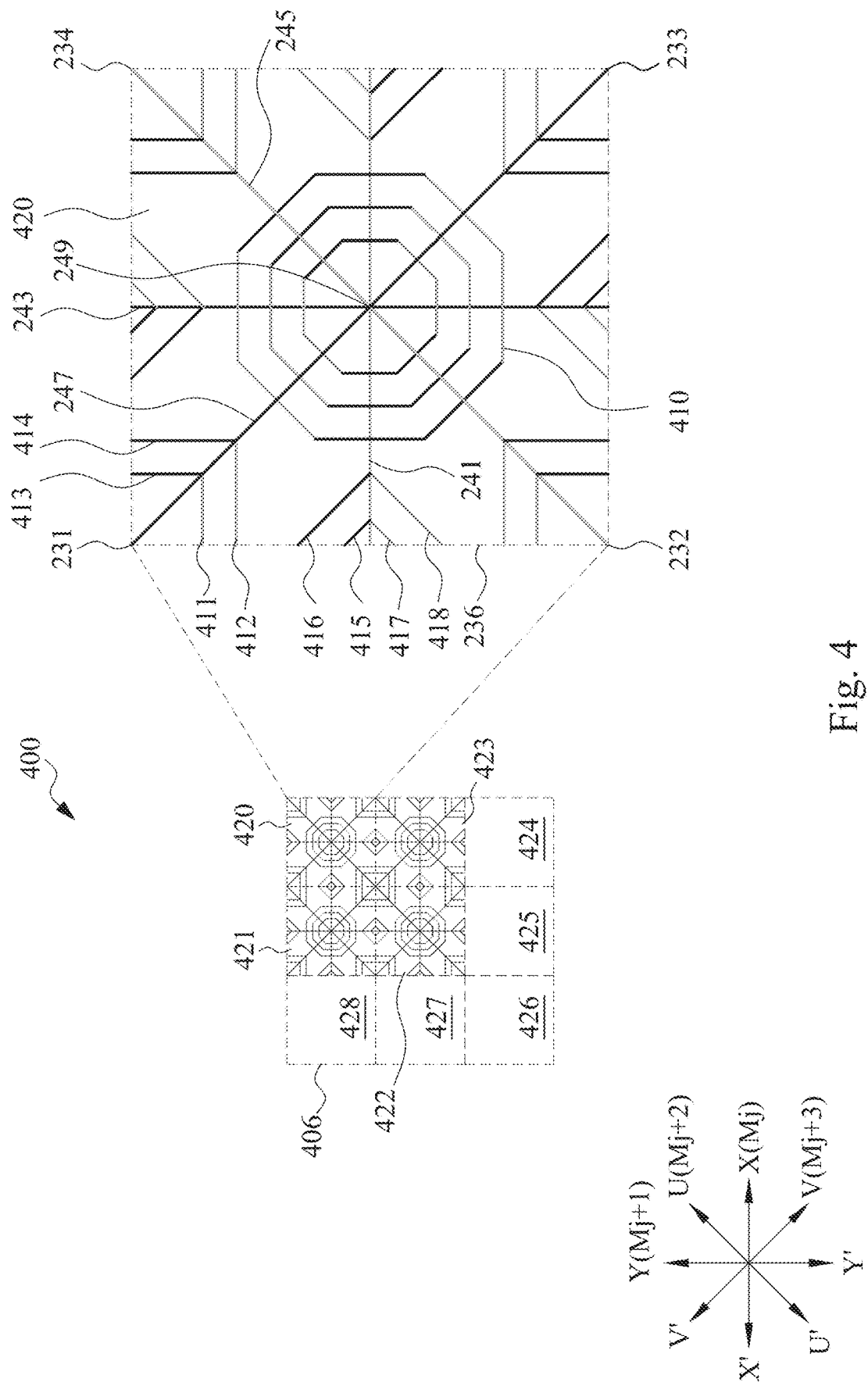

FIG. 4 is a schematic view of a layout of a clock mesh structure 400 for an IC device, in accordance with some embodiments. In at least one embodiment, the IC device comprising the clock mesh structure 400 corresponds to an IC device comprising the clock distribution system 100, or to the IC device 200. Components in FIG. 4 having corresponding components in FIG. 2A are designated by the same reference numerals, or by the reference numerals of FIG. 2A increased by 200. The clock mesh structure 400 is similar to the clock mesh structure 206, with one or more differences being described herein.

In FIG. 4, polygonal regions 420-428 of the clock mesh structure 400 are arranged in a repeating manner and abut each other. Metal patterns in the polygonal regions 420-423 are illustrated in FIG. 4. For simplicity, metal patterns in the other polygonal regions are omitted. In some embodiments, the polygonal regions 420-428 include clock drivers (not shown) which correspond to the clock driver 250. Each pair of adjacent polygonal regions among the polygonal regions 420-428 has metal patterns which are continuous, or overlap and are electrically coupled, to each other on a common boundary between the adjacent polygonal regions. For example, on the common boundary between the adjacent polygonal regions 420, 421, metal patterns of the polygonal region 420 are continuous, or overlap and are electrically coupled, to corresponding metal patterns of the polygonal region 421 at eleven points. In the example configuration in FIG. 4, the polygonal regions 420-428 are identical in both shape and layout of metal patterns. Other clock mesh structure configurations are within the scopes of various embodiments. For example, although the clock mesh structure 400 in FIG. 4 comprises nine polygonal regions 420-428, other numbers and/or arrangements of polygonal regions inside the clock mesh structure 400 are within the scopes of various embodiments. In at least one embodiment, the clock mesh structure 400 includes a single polygonal region, e.g., the polygonal region 420.

A difference between the clock mesh structure 400 and the clock mesh structure 206 includes additional feather-shaped or V-shaped structures, as illustrated in the enlarged view of the polygonal region 420 in FIG. 4. The polygonal region 420 is similar to the polygonal region 220 in that the polygonal region 420 also comprises main metal patterns 241, 243, 245, 247 overlapping at the center 249 and concentric polygons having the center 249 as a common center. Outside an outermost concentric polygon 410, feather-shaped or V-shaped structures are arranged on each end portion of each of the main metal patterns 241, 243, 245, 247. For example, X-axis metal patterns 411, 412 and Y-axis metal patterns 413, 414 branch out from an end portion of the V-axis metal pattern 247, in a region of the corner 231 and outside the outermost concentric polygon 410. The X-axis metal pattern 411 and the corresponding Y-axis metal pattern 413 form a V-shape flaring outwardly from the center 249. The X-axis metal pattern 412 and the corresponding Y-axis metal pattern 414 form a further, larger V-shape flaring outwardly from the center 249. The V-shape of the X-axis metal pattern 411 and the corresponding Y-axis metal pattern 413, and the larger V-shape of the X-axis metal pattern 412 and the corresponding Y-axis metal pattern 414 together form a feather-shaped structure. In at least one embodiment, one of the described V-shapes is omitted, or more than two V-shapes are arranged on the end portion of the V-axis metal pattern 247. Similar V-shaped or feather-shaped structures are arranged in regions of the other corners 232, 233, 234 of the polygonal region 420.

Further, V-axis metal patterns 415, 416 and U-axis metal patterns 417, 418 branch out from an end portion of the X-axis metal pattern 241, in a region between the side 236 and the outermost concentric polygon 410. The V-axis metal pattern 415 and the corresponding U-axis metal pattern 417 form a V-shape flaring outwardly from the center 249. The V-axis metal pattern 416 and the corresponding U-axis metal pattern 418 form a further, larger V-shape flaring outwardly from the center 249. The V-shape of the V-axis metal pattern 415 and the corresponding U-axis metal pattern 417, and the larger V-shape of the V-axis metal pattern 416 and the corresponding U-axis metal pattern 418 together form a feather-shaped structure. In at least one embodiment, one of the described V-shapes is omitted, or more than two V-shapes are arranged on the end portion of the X-axis metal pattern 241. Similar V-shaped or feather-shaped structures are arranged between the outermost concentric polygon 410 and other sides of the polygonal region 420. Along the side 236, the ends of the X-axis metal pattern 241, U-axis metal pattern 245, V-axis metal pattern 247 and the corresponding V-shaped or feather-shaped structures form electrical connections with corresponding ends of corresponding metal patterns in the adjacent polygonal region 421, as illustrated in FIG. 4. In at least one embodiment, one or more advantages described herein are achievable in an IC device having the clock mesh structure 400.

Figure 5:
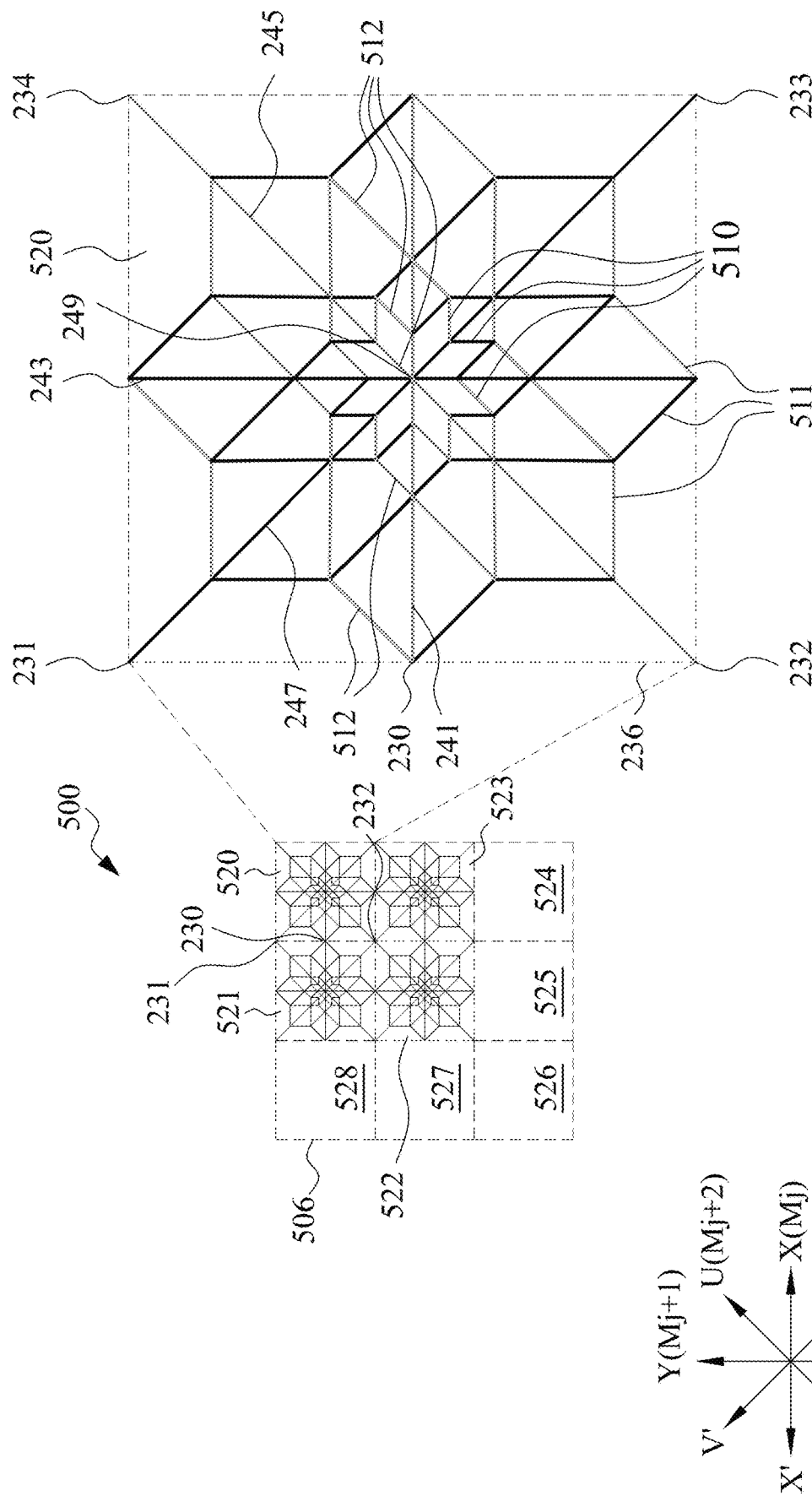

FIG. 5 is a schematic view of a layout of a clock mesh structure 500 for an IC device, in accordance with some embodiments. In at least one embodiment, the IC device comprising the clock mesh structure 500 corresponds to an IC device comprising the clock distribution system 100, or to the IC device 200. Components in FIG. 5 having corresponding components in FIG. 2A are designated by the same reference numerals, or by the reference numerals of FIG. 2A increased by 300. The clock mesh structure 500 is similar to the clock mesh structure 206, with one or more differences being described herein.

In FIG. 5, polygonal regions 520-528 of the clock mesh structure 500 are arranged in a repeating manner and abut each other. Metal patterns in the polygonal regions 520-523 are illustrated in FIG. 5. For simplicity, metal patterns in the other polygonal regions are omitted. In some embodiments, the polygonal regions 520-528 include clock drivers (not shown) which correspond to the clock driver 250. Each pair of adjacent polygonal regions among the polygonal regions 520-528 has metal patterns which are continuous, or overlap and are electrically coupled, to each other on a common boundary between the adjacent polygonal regions. For example, on the common boundary between the adjacent polygonal regions 520, 521, metal patterns of the polygonal region 520 overlap and are electrically coupled to corresponding metal patterns of the polygonal region 521 at three points 230, 231, 232. In the example configuration in FIG. 5, the polygonal regions 520-528 are identical in both shape and layout of metal patterns. Other clock mesh structure configurations are within the scopes of various embodiments. For example, although the clock mesh structure 500 in FIG. 5 comprises nine polygonal regions 520-528, other numbers and/or arrangements of polygonal regions inside the clock mesh structure 500 are within the scopes of various embodiments. In at least one embodiment, the clock mesh structure 500 includes a single polygonal region, e.g., the polygonal region 520.

A difference between the clock mesh structure 500 and the clock mesh structure 206 includes the layout of the metal patterns in each polygonal region. While the layout of metal patterns in the clock mesh structure 206 resembles a spider web, the layout of metal patterns in the clock mesh structure 500 resembles a snowflake, as illustrated in the enlarged view of the polygonal region 520 in FIG. 5. The polygonal region 520 is similar to the polygonal region 220 in that the polygonal region 520 also comprises main metal patterns 241, 243, 245, 247 overlapping at the center 249. The polygonal region 520 also comprises concentric polygons having a common center at the center 249; however, the concentric polygons in the polygonal region 520 have different shapes. For example, an innermost concentric polygon formed by metal patterns 510 has a different shape from an outermost polygon formed by metal patterns 511.

A further difference between the layouts of metal patterns in the polygonal region 520 and in the polygonal region 220 is that metal patterns branch out from each of the main metal patterns 241, 243, 245, 247 at acute angles. For example, all U-axis metal patterns 512 branching out from the X-axis metal pattern 241 form an acute angle, e.g., 45 degrees, with the X-axis metal pattern 241. Similarly, all V-axis metal patterns (not numbered) branching out from the X-axis metal pattern 241 form an acute angle, e.g., 45 degrees, with the X-axis metal pattern 241. In other words, other than the Y-axis metal pattern 243, the X-axis metal pattern 241 does not overlap another Y-axis metal pattern. Other than the X-axis metal pattern 241, the Y-axis metal pattern 243 does not overlap another X-axis metal pattern. Other than the V-axis metal pattern 247, the U-axis metal pattern 245 does not overlap another V-axis metal pattern. Other than the U-axis metal pattern 245, the V-axis metal pattern 247 does not overlap another U-axis metal pattern. In at least one embodiment, one or more advantages described herein are achievable in an IC device having the clock mesh structure 500.

Figure 6:
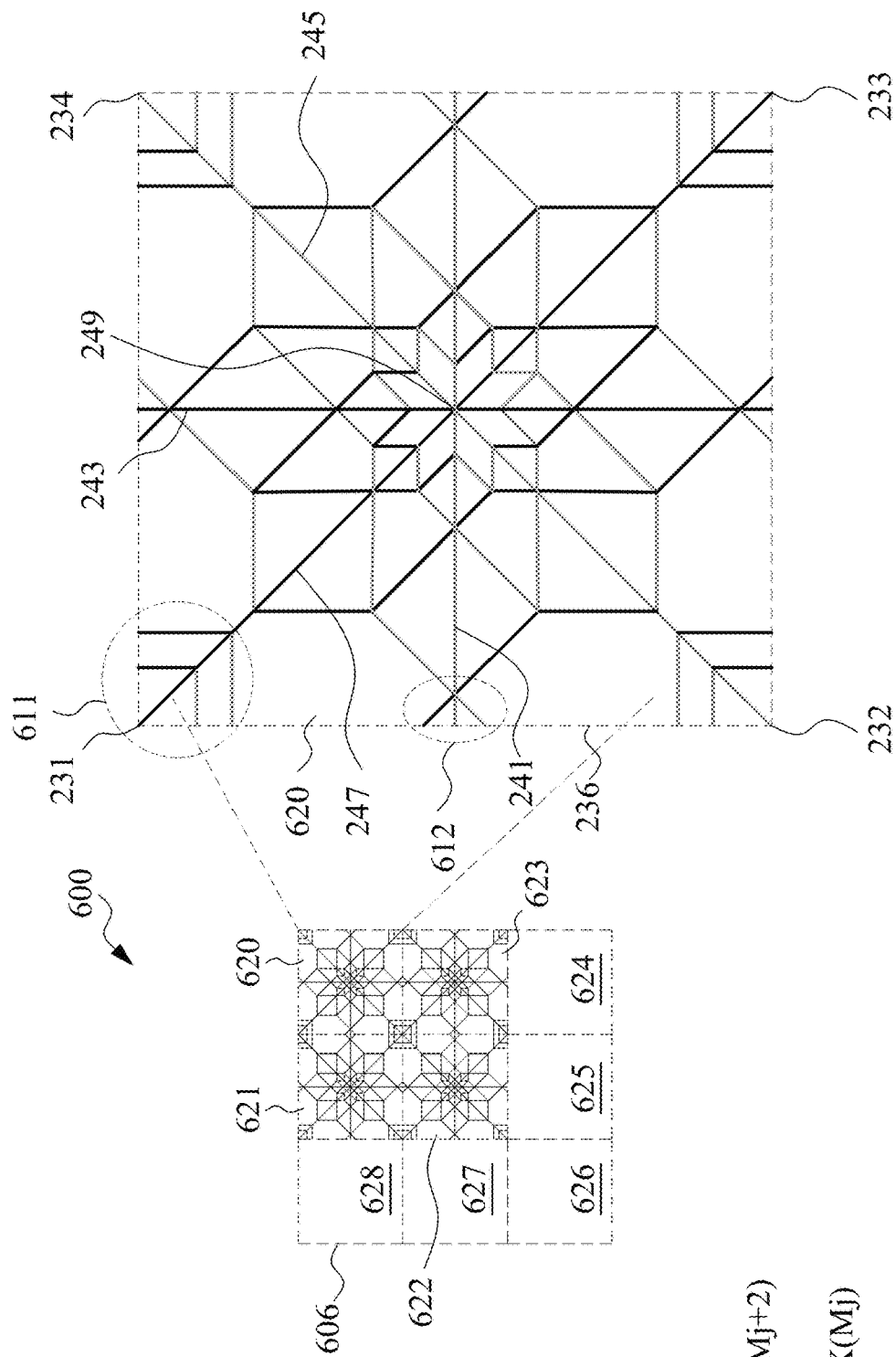

FIG. 6 is a schematic view of a layout of a clock mesh structure 600 for an IC device, in accordance with some embodiments. In at least one embodiment, the IC device comprising the clock mesh structure 600 corresponds to an IC device comprising the clock distribution system 100, or to the IC device 200. Components in FIG. 6 having corresponding components in FIG. 2A are designated by the same reference numerals, or by the reference numerals of FIG. 2A increased by 400. The clock mesh structure 600 is similar to the clock mesh structure 500, with one or more differences being described herein.

In FIG. 6, polygonal regions 620-628 of the clock mesh structure 600 are arranged in a repeating manner and abut each other. Metal patterns in the polygonal regions 620-623 are illustrated in FIG. 6. For simplicity, metal patterns in the other polygonal regions are omitted. In some embodiments, the polygonal regions 620-628 include clock drivers (not shown) which correspond to the clock driver 250. Each pair of adjacent polygonal regions among the polygonal regions 620-628 has metal patterns which are continuous, or overlap and are electrically coupled, to each other on a common boundary between the adjacent polygonal regions. For example, on the common boundary between the adjacent polygonal regions 620, 621, metal patterns of the polygonal region 620 overlap and are electrically coupled to corresponding metal patterns of the polygonal region 621 at nine points. In the example configuration in FIG. 6, the polygonal regions 620-628 are identical in both shape an layout of metal patterns. Other clock mesh structure configurations are within the scopes of various embodiments. For example, although the clock mesh structure 600 in FIG. 6 comprises nine polygonal regions 620-628, other numbers and/or arrangements of polygonal regions inside the clock mesh structure 600 are within the scopes of various embodiments. In at least one embodiment, the clock mesh structure 600 includes a single polygonal region, e.g., the polygonal region 620.

A difference between the clock mesh structure 600 and the clock mesh structure 500 includes the layout of metal patterns in each polygonal region, as best seen in the enlarged view of the polygonal region 620 in FIG. 6. The polygonal region 620 is similar to the polygonal region 520, except for the addition of feather-shaped or V-shaped structures exemplarily indicated at 611, 612. The feather-shaped or V-shaped structures 611, 612 are similar to the corresponding feather-shaped or V-shaped structures described with respect to FIG. 4. In at least one embodiment, one or more advantages described herein are achievable in an IC device having the clock mesh structure 600.

Figure 7:
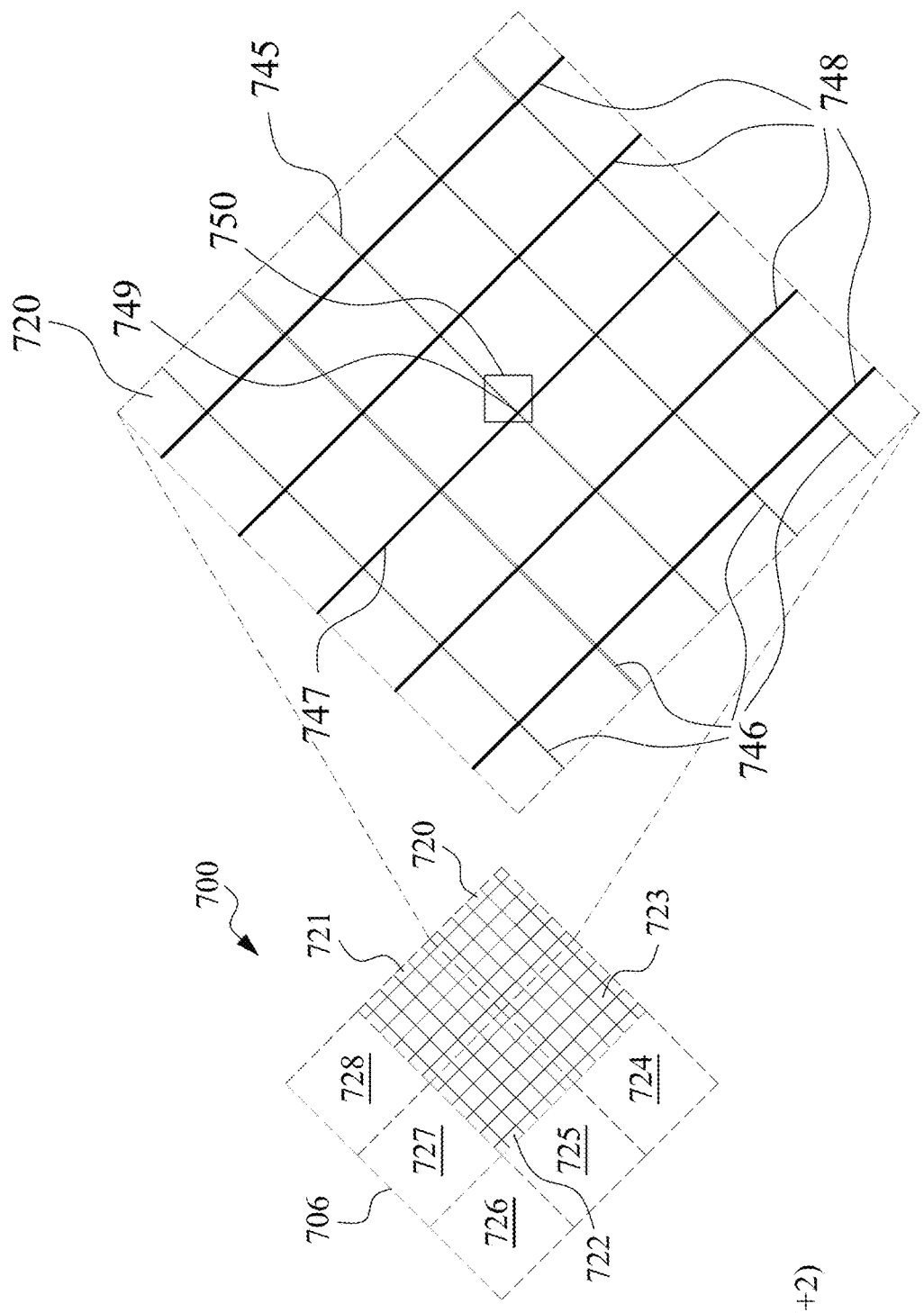

FIG. 7 is a schematic view of a layout of a clock mesh structure 700 for an IC device, in accordance with some embodiments. In at least one embodiment, the IC device comprising the clock mesh structure 700 corresponds to an IC device comprising the clock distribution system 100, or to the IC device 200. Components in FIG. 7 having corresponding components in FIG. 2A are designated by the same reference numerals, or by the reference numerals of FIG. 2A increased by 500.

In FIG. 7, polygonal regions 720-728 of the clock mesh structure 700 are arranged in a repeating manner and abut each other. Metal patterns in the polygonal regions 720-723 are illustrated in FIG. 7. For simplicity, metal patterns in the other polygonal regions are omitted. In some embodiments, the polygonal regions 720-728 include clock drivers as described herein. Each pair of adjacent polygonal regions among the polygonal regions 720-728 has metal patterns which are continuous to each other across a common boundary between the adjacent polygonal regions. For example, on the common boundary between the adjacent polygonal regions 720, 721, five metal patterns of the polygonal region 720 are continuous to five corresponding metal patterns of the polygonal region 721. In the example configuration in FIG. 7, the polygonal regions 720-728 are identical in both shape and layout of metal patterns. Other clock mesh structure configurations are within the scopes of various embodiments. For example, although the clock mesh structure 700 in FIG. 7 comprises nine polygonal regions 720-728, other numbers and/or arrangements of polygonal regions inside the clock mesh structure 700 are within the scopes of various embodiments. In at least one embodiment, the clock mesh structure 700 includes a single polygonal region, e.g., the polygonal region 720.

The polygonal region 720 comprises metal patterns extending along the U-U' axis and V-V' axis, without no metal pattern extending in the X-X' axis or Y-Y' axis. For example, the polygonal region 720 comprises U-axis metal patterns 745, 746, and V-axis metal patterns 747, 748. The U-axis metal pattern 745 and the V-axis metal pattern 747 are main metal patterns, or trunks, which overlap and are electrically coupled to each other at a center 749 of the polygonal region 720. A clock driver 750 has an output electrically coupled to the U-axis metal pattern 745 and the V-axis metal pattern 747 at the center 749. In at least one embodiment, the clock driver 750 corresponds to at least one of the clock drivers 113-116 described with respect to FIG. 1. In at least one embodiment, a clock driver corresponding to the clock driver 750 is included in each of the other polygonal regions 721-728 of the clock mesh structure 700, but is not illustrated for simplicity. In the example configuration in FIG. 7, the center 749 is a symmetrical center of the polygonal region 720, i.e., the layout of the metal patterns in the polygonal region 720 is symmetric about the center 749. Other configurations are within the scopes of various embodiments. In at least one embodiment, one or more advantages described herein are achievable in an IC device having the clock mesh structure 700.

FIG. 8A is a schematic view of a layout of a clock tree 800A, in accordance with some embodiments. In at least one embodiment, the IC device comprising the clock tree 800A corresponds to an IC device comprising the clock distribution system 100, or to the IC device 200. In some embodiments, the IC device comprising the clock tree 800A also comprises at least one of the clock mesh structures 206, 300-700, wherein the clock tree 800A is a pre-mesh clock tree or a post-mesh clock tree.

In the example configuration in FIG. 8A, the clock tree 800A has a single tier comprising a first metal pattern 801 and a second metal pattern 802. The first metal pattern 801 and the second metal pattern 802 overlap and are electrically coupled to each other at an overlapping point 803. A clock driver 804 has an output electrically coupled to the first metal pattern 801 and the second metal pattern 802 at the overlapping point 803. An input of the clock driver 804 is electrically coupled to receive a clock signal from, for example, a clock source, a clock mesh structure, another clock tree or clock tree tier. The output of the clock driver 804, the first metal pattern 801 and the second metal pattern 802 are electrically coupled together by one or more via structures, in a manner similar to one or more via structures described with respect to FIGS. 2B-2E. Opposite ends 805, 806 of the first metal pattern 801, and opposite ends 807, 808 of the second metal pattern 802 are configured to deliver the clock signal downstream, e.g., to at least one of a clock mesh structure, a clock driver, a clock load, another clock tree or clock tree tier.

The first metal pattern 801 and the second metal pattern 802 are slanted or oblique to both the X-X' axis and the Y-Y' axis. For example, the first metal pattern 801 extends along a P-P' axis, and is referred to herein as a P-axis metal pattern. The second metal pattern 802 extends along a Q-Q' axis, and is referred to herein as a Q-axis metal pattern. The P-P' axis is transverse to the Q-Q' axis. In one or more embodiments, the P-P' axis is perpendicular to the Q-Q' axis. In at least one embodiment, P-P' axis is oblique, i.e., not perpendicular, to the Q-Q' axis. Each of the P-P' axis and the Q-Q' axis forms acute angles with both the X-X' axis and the Y-Y' axis, in a manner similar to the U-U' axis and the V-V' axis. In the example configuration in FIG. 8A, the P-P' axis and the Q-Q' axis form with the X-X' axis and Y-Y' axis 45 degree angles.

Other configurations are within the scopes of various embodiments. In some embodiments, when the clock tree 800A and at least one of the clock mesh structures 206, 300-700 are included in the same IC device, both P-P' axis and Q-Q' axis are different from both U-U' axis and V-V' axis, or at least one of the P-P' axis and Q-Q' axis is the same as at least one of the U-U' axis and V-V' axis.

In some embodiments, metal patterns extending along different axes are formed in different metal layers. For example, the P-axis metal pattern 801 is formed in a metal layer Mk+1, and the Q-axis metal pattern 802 is formed in a metal layer Mk, which is the metal layer immediately below the metal layer Mk+1. In some embodiments, the metal layers Mk, Mk+1 are metal layers in an interconnect structure corresponding to the interconnect structure 260 in the IC device 200, and the metal layer Mk is any metal layer above the M1 layer. The described order of the P-axis metal pattern 801 being in a metal layer higher than the Q-axis metal pattern 802 is an example. A reversed order of the Q-axis metal pattern 802 being in a metal layer higher than the P-axis metal pattern 801 is within the scopes of various embodiments. In one or more embodiments, the metal layers containing the P-axis metal pattern 801 and Q-axis metal pattern 802 are non-consecutive metal layers. In some embodiments, when the clock tree 800A and at least one of the clock mesh structures 206, 300-700 are included in the same IC device, both metal layers Mk, Mk+1 of the clock tree 800A are different from all metal layers Mj, Mj+1, Mj+2, Mj+3 of the clock mesh structure, or at least one of the metal layers Mk, Mk+1 is the same as at least one of the metal layers Mj, Mj+1, Mj+2, Mj+3.

In the example configuration in FIG. 8A, the clock tree 800A is square and the overlapping point 803 is a symmetrical center of the clock tree 800A, i.e., the layout of the P-axis metal pattern 801 and Q-axis metal pattern 802 is symmetric about the overlapping point 803. Other configurations are within the scopes of various embodiments. In at least one embodiment, the layout of the clock tree 800A is a predetermined layout, e.g., a layout stored as a cell in a cell library, and is placed into a layout of an IC device to be designed or manufactured by an APR tool. In at least one embodiment, the layout of the clock tree 800A is generated by an APR tool based on specifics of circuitry of the IC device to be designed or manufactured. In at least one embodiment, one or more advantages described herein are achievable in an IC device having the clock tree 800A. Further, the clock tree 800A in one or more embodiments makes it possible to reduce the wire length or clock path by about 30%, compared to other approaches that do not include a clock tree with slanted or oblique metal patterns.

FIG. 8B is a schematic view of a layout of a clock tree 800B, in accordance with some embodiments. In at least one embodiment, the IC device comprising the clock tree 800B corresponds to an IC device comprising the clock distribution system 100, or to the IC device 200. In some embodiments, the IC device comprising the clock tree 800B also comprises at least one of the clock mesh structures 206, 300-700, wherein the clock tree 800B is a pre-mesh clock tree or a post-mesh clock tree.

In the example configuration in FIG. 8B, the clock tree 800B has an upper tier and a lower tier. The upper tier of the clock tree 800B corresponds to the clock tree 800A, and includes components designated by the same reference numerals as the clock tree 800A. The lower tier of the clock tree 800B comprises blocks, or branches, 810, 820, 830, 840 each of which has a configuration similar to the configuration of the clock tree 800A, and is electrically coupled to a corresponding one of the ends 807, 806, 805, 808 of the P-axis metal pattern 801 and Q-axis metal pattern 802 in the upper tier. For example, the block 810 comprises a P-axis metal pattern 811 and a Q-axis metal pattern 812 which overlap and are electrically coupled to each other at an overlapping point 813. A clock driver 814 has an input electrically coupled to the end 807 of the Q-axis metal pattern 802 on the upper tier, and an output electrically coupled to the overlapping point 813. Opposite ends (not numbered) of the P-axis metal pattern 811 and Q-axis metal pattern 812 are configured to deliver the clock signal further downstream. A description of the similarly configured blocks 820, 830, 840 is omitted. In some embodiments, the clock tree 800B comprises more than two tiers. In at least one embodiment, one or more advantages described herein are achievable in an IC device having the clock tree 800B.

FIG. 9A is a schematic view of a layout of a clock tree 900A, in accordance with some embodiments. In at least one embodiment, the IC device comprising the clock tree 900A corresponds to an IC device comprising the clock distribution system 100, or to the IC device 200. In some embodiments, the IC device comprising the clock tree 900A also comprises at least one of the clock mesh structures 206, 300-700, wherein the clock tree 900A is a pre-mesh clock tree or a post-mesh clock tree.

In the example configuration in FIG. 9A, the clock tree 900A has a single tier comprising P-axis metal patterns 901, 911, Q-axis metal patterns 902, 912, and an X-axis metal pattern 913. The P-axis metal pattern 901, Q-axis metal pattern 912 and X-axis metal pattern 913 overlap and are electrically coupled to each other at an overlapping point 914 which is an end of the X-axis metal pattern 913. The P-axis metal pattern 911, Q-axis metal pattern 902 and X-axis metal pattern 913 overlap and are electrically coupled to each other at a further overlapping point 915 which is an opposite end of the X-axis metal pattern 913. A midpoint 903 of the X-axis metal pattern 913 is electrically coupled to an output of a clock driver 904 to receive a clock signal, e.g., as described with respect to the clock tree 800A. Ends 905, 906, 907, 908 of the P-axis metal patterns 901, 911, Q-axis metal patterns 902, 912 are configured to deliver the clock signal downstream, e.g., as described with respect to the clock tree 800A. In some embodiments, the clock driver 904 corresponds to the clock driver 804. The X-axis metal pattern 913 is arranged in a metal layer Mk+2. This is an example, and other configurations are within the scopes of various embodiments. In some embodiments, the metal pattern 913 is a Y-axis metal pattern.

In the example configuration in FIG. 9A, the midpoint 903 of the X-axis metal pattern 913 is a symmetrical center of the clock tree 900A, i.e., the layout of the metal patterns in the clock tree 900A is symmetric about the midpoint 903. Other configurations are within the scopes of various embodiments. In at least one embodiment, the layout of the clock tree 900A is a predetermined layout, e.g., a layout stored as a cell in a cell library, and is placed into a layout of an IC device to be designed or manufactured by an APR tool. In at least one embodiment, the layout of the clock tree 900A is generated by an APR tool based on specifics of circuitry of the IC device to be designed or manufactured. In at least one embodiment, one or more advantages described herein are achievable in an IC device having the clock tree 900A. Further, the clock tree 900A has a dimension d1 along the X-X' axis and a dimension d2 along the Y-Y' axis. In at least one embodiment, by varying a ratio d1/d2, it is possible to achieve various reductions in the wire length or clock path up to about 30%, compared to other approaches that do not include a clock tree with slanted or oblique metal patterns.

FIG. 9B is a schematic view of a layout of a clock tree 900B, in accordance with some embodiments. In at least one embodiment, the IC device comprising the clock tree 900B corresponds to an IC device comprising the clock distribution system 100, or to the IC device 200. In some embodiments, the IC device comprising the clock tree 900B also comprises at least one of the clock mesh structures 206, 300-700, wherein the clock tree 900B is a pre-mesh clock tree or a post-mesh clock tree.

In the example configuration in FIG. 9B, the clock tree 900B has an upper tier and a lower tier. The upper tier of the clock tree 900B corresponds to the clock tree 900A, and includes components designated by the same reference numerals as the clock tree 900A. The lower tier of the clock tree 900B comprises blocks, or branches, 920, 940, 960, 980 each of which has a configuration similar to the configuration of the clock tree 900A, and is electrically coupled to a corresponding one of the ends 907, 906, 905, 908 of the P-axis metal patterns 901, 911, Q-axis metal patterns 902, 912 in the upper tier. For example, the block 920 comprises P-axis metal patterns 921, 931, Q-axis metal patterns 922, 932, and a X-axis metal pattern 933. The P-axis metal patterns 921, 931, Q-axis metal patterns 922, 932, and a X-axis metal pattern 933 overlap and are electrically coupled to each other at opposite ends of the X-axis metal pattern 933. A clock driver 924 has an input electrically coupled to the end 907 of the Q-axis metal pattern 912 on the upper tier, and an output electrically coupled to a midpoint of the X-axis metal pattern 933. Free ends (not numbered) of the P-axis metal patterns 921, 931, Q-axis metal patterns 922, 932 are configured to deliver the clock signal further downstream. A description of the similarly configured blocks 940, 960, 980 is omitted. In some embodiments, the clock tree 900B comprises more than two tiers. In at least one embodiment, one or more advantages described herein are achievable in an IC device having the clock tree 900B.

FIG. 10A is a schematic view of a layout of a clock tree 1000A, in accordance with some embodiments. In at least one embodiment, the IC device comprising the clock tree 1000A corresponds to an IC device comprising the clock distribution system 100, or to the IC device 200. In some embodiments, the IC device comprising the clock tree 1000A also comprises at least one of the clock mesh structures 206, 300-700, wherein the clock tree 1000A is a pre-mesh clock tree or a post-mesh clock tree. Components in FIG. 10A having corresponding components in FIG. 9A are designated by the same reference numerals. For simplicity, a clock driver corresponding to the clock driver 904 is not illustrated in FIG. 10A. The clock tree 1000A is similar to the clock tree 900A, with one or more differences being described herein.

Compared to the clock tree 900A, the clock tree 1000A additionally comprises shielding metal patterns. For each clock metal pattern among the P-axis metal patterns 901, 911, Q-axis metal patterns 902, 912, and X-axis metal pattern 913, a pair of shielding metal patterns is arranged along and on opposite sides of the clock metal pattern and in the same metal layer as the clock metal pattern. For example, shielding metal patterns 1001, 1002, which are P-axis metal patterns, are arranged along and on opposite sides of the P-axis metal pattern 901 and in the same metal layer Mk+1 as the P-axis metal pattern 901. Shielding metal patterns 1011, 1012, which are P-axis metal patterns, are arranged along and on opposite sides of the P-axis metal pattern 911 and in the same metal layer Mk+1 as the P-axis metal pattern 911. Shielding metal patterns 1003, 1004, which are Q-axis metal patterns, are arranged along and on opposite sides of the Q-axis metal pattern 902 and in the same metal layer Mk as the Q-axis metal pattern 902. Shielding metal patterns 1013, 1014, which are Q-axis metal patterns, are arranged along and on opposite sides of the Q-axis metal pattern 912 and in the same metal layer Mk as the Q-axis metal pattern 912. Shielding metal patterns 1015, 1016, which are X-axis metal patterns, are arranged along and on opposite sides of the X-axis metal pattern 913 and in the same metal layer Mk+2 as the X-axis metal pattern 913. In some embodiments, the shielding metal patterns on opposite sides of a clock metal pattern are arranged at the same distance to the clock metal pattern. For example, a center-to-center distance between a center of the P-axis metal pattern 911 and a center of the shielding metal pattern 1011 is the same as a center-to-center distance between the center of the P-axis metal pattern 911 and a center of the shielding metal pattern 1012, as indicated at d3 in FIG. 10A. In at least one embodiment, d3 is the metal pitch between immediately adjacent metal patterns in the metal layer that contains the corresponding shielding metal patterns and clock metal pattern.

In some embodiments, each of the shielding metal patterns 1001-1004, 1011-1016 is configured to receive a power supply voltage, such as a positive power supply voltage VDD or a ground voltage VSS. As a result, in at least one embodiment, interference between a clock signal distributed by the clock tree 1000A and other non-clock signals is preventable or reduced.

In the example configuration in FIG. 10A, the midpoint 903 of the X-axis metal pattern 913 is a symmetrical center of the clock tree 1000A, i.e., the layout of the metal patterns in the clock tree 1000A is symmetric about the midpoint 903. Other configurations are within the scopes of various embodiments. In at least one embodiment, the layout of the clock tree 1000A is a predetermined layout, e.g., a layout stored as a cell in a cell library, and is placed into a layout of an IC device to be designed or manufactured by an APR tool. In at least one embodiment, the layout of the clock tree 1000A is generated by an APR tool based on specifics of circuitry of the IC device to be designed or manufactured. In at least one embodiment, one or more advantages described herein are achievable in an IC device having the clock tree 1000A.

FIG. 10B is a schematic view of a layout of a clock tree 1000B, in accordance with some embodiments. In at least one embodiment, the IC device comprising the clock tree 1000B corresponds to an IC device comprising the clock distribution system 100, or to the IC device 200. In some embodiments, the IC device comprising the clock tree 1000B also comprises at least one of the clock mesh structures 206, 300-700, wherein the clock tree 1000B is a pre-mesh clock tree or a post-mesh clock tree. Components in FIG. 10B having corresponding components in FIG. 9B are designated by the same reference numerals, or designated by the reference numerals of FIG. 9B increased by 100. For simplicity, clock drivers are not illustrated in FIG. 10B.

The clock tree 1000B is similar to the clock tree 900B, except for the addition of a pair of shielding metal patterns alongside each clock metal pattern, as described with respect to FIG. 10A. Example shielding metal patterns are indicated in FIG. 10B for a block 1020 among blocks 1020, 1040, 1060, 1080 on a lower tier of the clock tree 1000B. Specifically, the block 1020 includes shielding metal patterns 1035 which are P-axis metal patterns, shielding metal patterns 1036 which are Q-axis metal patterns, and shielding metal patterns 1037 which are X-axis metal patterns. In some embodiments, the clock tree 1000B comprises more than two tiers. In at least one embodiment, one or more advantages described herein are achievable in an IC device having the clock tree 1000B.

FIG. 11A is a schematic view of a layout of a clock tree 1100A, in accordance with some embodiments. In at least one embodiment, the IC device comprising the clock tree 1100A corresponds to an IC device comprising the clock distribution system 110, or to the IC device 200. In some embodiments, the IC device comprising the clock tree 1100A also comprises at least one of the clock mesh structures 206, 300-700, wherein the clock tree 1100A is a pre-mesh clock tree or a post-mesh clock tree. Components in FIG. 11A having corresponding components in FIG. 10A are designated by the same reference numerals. For simplicity, a clock driver corresponding to the clock driver 904 is not illustrated in FIG. 11A. The clock tree 1100A is similar to the clock tree 1000A, with one or more differences being described herein.

Compared to the clock tree 1000A, the clock tree 1100A additionally comprises further shielding metal patterns, also referred to herein as cross-shielding metal patterns. For each clock metal pattern among the P-axis metal patterns 901, 911, Q-axis metal patterns 902, 912, and X-axis metal pattern 913, one or more cross-shielding metal patterns extend across the clock metal pattern, overlap and are electrically coupled to a corresponding pair of shielding metal patterns on opposite sides of the clock metal pattern.

For example, cross-shielding metal patterns 1101 extend across the P-axis metal pattern 901, overlap and are electrically coupled, e.g., by via structures, to the corresponding pair of shielding metal patterns 1001, 1002 on opposite sides of the P-axis metal pattern 901. Further, cross-shielding metal patterns 1111 extend across the P-axis metal pattern 911, overlap and are electrically coupled, e.g., by via structures, to the corresponding pair of shielding metal patterns 1011, 1012 on opposite sides of the P-axis metal pattern 911. In at least one embodiment, the cross-shielding metal patterns 1101, 1111 are Q-axis metal patterns. Other directions of the cross-shielding metal patterns 1101, 1111 are within the scopes of various embodiments. In some embodiments, one or more of the cross-shielding metal patterns 1101, 1111 are arranged in a metal layer under or over the metal layer Mk+1 in which the P-axis metal patterns 901, 911, and the corresponding shielding metal patterns 1001, 1002, 1011, 1012 are arranged. In one or more embodiments, one or more of the cross-shielding metal patterns 1101, 1111 are arranged both under and over the P-axis metal patterns 901, 911 and shielding metal patterns 1001, 1002, 1011, 1012. In at least one embodiment, one or more of the cross-shielding metal patterns 1101, 1111 are arranged in the same metal layer Mk as the Q-axis metal patterns 902, 912.

Cross-shielding metal patterns 1102 extend across the Q-axis metal pattern 902, overlap and are electrically coupled, e.g., by via structures, to the corresponding pair of shielding metal patterns 1003, 1004 on opposite sides of the Q-axis metal pattern 902. Further, cross-shielding metal patterns 1112 extend across the Q-axis metal pattern 912, overlap and are electrically coupled, e.g., by via structures, to the corresponding pair of shielding metal patterns 1013, 1014 on opposite sides of the Q-axis metal pattern 912. In at least one embodiment, the cross-shielding metal patterns 1102, 1112 are P-axis metal patterns. Other directions of the cross-shielding metal patterns 1102, 1112 are within the scopes of various embodiments. In some embodiments, one or more of the cross-shielding metal patterns 1102, 1112 are arranged in a metal layer under or over the metal layer Mk in which the Q-axis metal patterns 902, 912, and the corresponding shielding metal patterns 1003, 1004, 1013, 1014 are arranged. In one or more embodiments, one or more of the cross-shielding metal patterns 1102, 1112 are arranged both under and over the Q-axis metal patterns 902, 912, and shielding metal patterns 1003, 1004, 1013, 1014. In at least one embodiment, one or more of the cross-shielding metal patterns 1102, 1112 are arranged in the same metal layer Mk+1 as the P-axis metal patterns 901, 911.

Cross-shielding metal patterns 1113 extend across the X-axis metal pattern 913, overlap and are electrically coupled, e.g., by via structures, to the corresponding pair of shielding metal patterns 1015, 1016 on opposite sides of the X-axis metal pattern 913. In at least one embodiment, the cross-shielding metal patterns 1113 are Y-axis metal patterns. Other directions of the cross-shielding metal patterns 1113 are within the scopes of various embodiments. In some embodiments, one or more of the cross-shielding metal patterns 1113 are arranged in a metal layer under or over the metal layer Mk+2 in which the X-axis metal pattern 913 and the corresponding shielding metal patterns 1015, 1016 are arranged. In one or more embodiments, one or more of the cross-shielding metal patterns 1113 are arranged both under and over the X-axis metal pattern 913 and shielding metal patterns 1015, 1016. In at least one embodiment, one or more of the cross-shielding metal patterns 1113 are arranged in a metal layer Mk+3 immediately above the metal layer Mk+2 in which the X-axis metal pattern 913 and the shielding metal patterns 1015, 1016 are arranged. Other metal layers containing the cross-shielding metal patterns 1113 are within the scopes of various embodiments.

In some embodiments, each of the cross-shielding metal patterns 1101, 1102, 1111, 1112, 1113 is configured to receive a power supply voltage, such as a positive power supply voltage VDD or a ground voltage VSS. As a result, in at least one embodiment, interference between a clock signal distributed by the clock tree 1100A and other non-clock signals is preventable or reduced.

In the example configuration in FIG. 11A, the midpoint 903 of the X-axis metal pattern 913 is a symmetrical center of the clock tree 1100A, i.e., the layout of the metal patterns in the clock tree 1100A is symmetric about the midpoint 903. Other configurations are within the scopes of various embodiments. In at least one embodiment, the layout of the clock tree 1100A is a predetermined layout, e.g., a layout stored as a cell in a cell library, and is placed into a layout of an IC device to be designed or manufactured by an APR tool. In at least one embodiment, the layout of the clock tree 1100A is generated by an APR tool based on specifics of circuitry of the IC device to be designed or manufactured. In at least one embodiment, one or more advantages described herein are achievable in an IC device having the clock tree 1100A.

FIG. 11B is a schematic view of a layout of a clock tree 1100B, in accordance with some embodiments. In at least one embodiment, the IC device comprising the clock tree 1100B corresponds to an IC device comprising the clock distribution system 110, or to the IC device 200. In some embodiments, the IC device comprising the clock tree 1100B also comprises at least one of the clock mesh structures 206, 300-700, wherein the clock tree 1100B is a pre-mesh clock tree or a post-mesh clock tree. Components in FIG. 11B having corresponding components in FIG. 10B are designated by the same reference numerals, or designated by the reference numerals of FIG. 10B increased by 110. For simplicity, clock drivers are not illustrated in FIG. 11B.

The clock tree 1100B is similar to the clock tree 1000B, except for the addition of cross-shielding metal patterns which overlap and electrically couple corresponding pairs of shielding metal patterns, as described with respect to FIG. 11A. Example cross-shielding metal patterns 1121 are indicated in FIG. 11B for a block 1120 among blocks 1120, 1140, 1160, 1180 on a lower tier of the clock tree 1100B. In some embodiments, the clock tree 1100B comprises more than two tiers. In at least one embodiment, one or more advantages described herein are achievable in an IC device having the clock tree 1100B.

FIG. 12A is a schematic view of a layout of a clock tree 1200A, in accordance with some embodiments. In at least one embodiment, the IC device comprising the clock tree 1200A corresponds to an IC device comprising the clock distribution system 100, or to the IC device 200. In some embodiments, the IC device comprising the clock tree 1200A also comprises at least one of the clock mesh structures 206, 300-700, wherein the clock tree 1200A is a pre-mesh clock tree or a post-mesh clock tree.

In the example configuration in FIG. 12A, the clock tree 1200A has a single tier comprising a pair of first metal patterns 1201, 1202, and a second metal pattern 1203. Each of the first metal patterns 1201, 1202 overlaps and is electrically coupled to a corresponding one of the opposite ends of the second metal pattern 1203. A clock driver 1209 has an output electrically coupled to a midpoint 1204 of the second metal pattern 1203. An input of the clock driver 1209 is electrically coupled to receive a clock signal from, for example, a clock source, a clock mesh structure, another clock tree or clock tree tier. The output of the clock driver 1209 and the second metal pattern 1203 are electrically coupled together by one or more via structures, in a manner similar to one or more via structures described with respect to FIGS. 2B-2E. Opposite ends 1205, 1206 of the first metal pattern 1201, and opposite ends 1207, 1208 of the other first metal pattern 1202 are configured to deliver the clock signal downstream, e.g., to at least one of a clock mesh structure, a clock driver, a clock load, another clock tree or clock tree tier. The arrangement of the first metal patterns 1201, 1202 connected by the second metal pattern 1203 forms an H-shape.

The first metal patterns 1201, 1202, and the second metal pattern 1203 are slanted or oblique to both the X-X' axis and the Y-Y' axis. For example, the first metal patterns 1201, 1202 are P-axis metal patterns arranged in the metal layer Mk+1, and the second metal pattern 1203 is a Q-axis metal pattern arranged in the metal layer Mk. The described order of the P-axis metal patterns 1201, 1202 being in a metal layer higher than the Q-axis metal pattern 1203 is an example. A reversed order of the Q-axis metal pattern 1203 being in a metal layer higher than the P-axis metal patterns 1201, 1202 is within the scopes of various embodiments. In one or more embodiments, the metal layer containing the P-axis metal patterns 1201, 1202 and the metal layer containing the Q-axis metal pattern 1203 are non-consecutive metal layers. In some embodiments, when the clock tree 1200A and at least one of the clock mesh structures 206, 300-700 are included in the same IC device, both metal layers Mk, Mk+1 of the clock tree 1200A are different from all metal layers Mj, Mj+1, Mj+2, Mj+3 of the clock mesh structure, or at least one of the metal layers Mk, Mk+1 is the same as at least one of the metal layers Mj, Mj+1, Mj+2, Mj+3.

In the example configuration in FIG. 12A, the clock tree 1200A is square and the midpoint 1204 of the second metal pattern 1203 is a symmetrical center of the clock tree 1200A, i.e., the layout of the P-axis metal patterns 1201, 1202 and Q-axis metal pattern 1203 is symmetric about the midpoint 1204. Other configurations are within the scopes of various embodiments. In at least one embodiment, the layout of the clock tree 1200A is a predetermined layout, e.g., a layout stored as a cell in a cell library, and is placed into a layout of an IC device to be designed or manufactured by an APR tool. In at least one embodiment, the layout of the clock tree 1200A is generated by an APR tool based on specifics of circuitry of the IC device to be designed or manufactured. In at least one embodiment, one or more advantages described herein are achievable in an IC device having the clock tree 1200A.

FIG. 12B is a schematic view of a layout of a clock tree 1200B, in accordance with some embodiments. In at least one embodiment, the IC device comprising the clock tree 1200B corresponds to an IC device comprising the clock distribution system 100, or to the IC device 200. In some embodiments, the IC device comprising the clock tree 1200B also comprises at least one of the clock mesh structures 206, 300-700, wherein the clock tree 1200B is a pre-mesh clock tree or a post-mesh clock tree.

In the example configuration in FIG. 12B, the clock tree 1200B has an upper tier and a lower tier. The upper tier of the clock tree 1200B corresponds to the clock tree 1200A, and includes components designated by the same reference numerals as the clock tree 1200A. The lower tier of the clock tree 1200B comprises blocks, or branches, 1210, 1220, 1230, 1240 each of which has a configuration similar to the configuration of the clock tree 1200A, and is electrically coupled to a corresponding one of the ends 1206, 1208, 1205, 1207 of the P-axis metal patterns 1201, 1202 in the upper tier. For example, the block 1210 comprises a pair of P-axis metal patterns 1211, 1212 which overlap and are electrically coupled to corresponding ends of a Q-axis metal pattern 1213. A clock driver 1219 has an input electrically coupled to the end 1206 of the P-axis metal pattern 1201 on the upper tier, and an output electrically coupled to a midpoint of the Q-axis metal pattern 1213. Opposite ends (not numbered) of the P-axis metal patterns 1211, 1212 are configured to deliver the clock signal further downstream. A description of the similarly configured blocks 1220, 1230, 1240 is omitted. As illustrated in FIG. 12B, the metal patterns in the upper tier form a larger H-shape, and the metal patterns in each of the blocks 1210, 1220, 1230, 1240 in the lower tier form a smaller H-shape. In some embodiments, the clock tree 1200B comprises more than two tiers. In at least one embodiment, one or more advantages described herein are achievable in an IC device having the clock tree 1200B.

FIG. 12C is a schematic view of a layout of a clock tree 1200C, in accordance with some embodiments. In at least one embodiment, the IC device comprising the clock tree 1200C corresponds to an IC device comprising the clock distribution system 100, or to the IC device 200. In some embodiments, the IC device comprising the clock tree 1200C also comprises at least one of the clock mesh structures 206, 300-700, wherein the clock tree 1200C is a pre-mesh clock tree or a post-mesh clock tree. Components in FIG. 12C having corresponding components in FIG. 12B are designated by the same reference numerals. The clock tree 1200C is similar to the clock tree 1200B, with one or more differences being described herein.

Compared to the clock tree 900A, the clock tree 1200C comprises at least one clock spine which partially forms each of two adjacent H-shapes on the lower tier, and continuously extends from one of the two adjacent H-shapes to the other. For example, the clock tree 1200C comprises a clock spine 1250 which partially forms each of two H-shapes in the adjacent blocks 1210, 1230 on the lower tier. The clock spine 1250 in FIG. 12C replaces the P-axis metal pattern 1211 in the H-shape of the block 1210 and the P-axis metal pattern 1231 in the H-shape of the block 1230 in FIG. 12B. The clock spine 1250 in FIG. 12C further extends continuously from the H-shape of the block 1210 to the H-shape of the block 1230. The clock tree 1200C further comprises a similar clock spine 1260 which replaces the P-axis metal pattern 1222 in the H-shape of the block 1220 and the P-axis metal pattern 1242 in the H-shape of the block 1240 in FIG. 12B. The clock spine 1260 in FIG. 12C further extends continuously from the H-shape of the block 1220 to the H-shape of the block 1240. In the example configuration in FIG. 12C, each of the clock spines 1250, 1260 has a width d4 greater than other metal patterns on the lower tier. In at least one embodiment, the greater width permits the clock spines 1250, 1260 to properly deliver the clock signal to a plurality of clock loads 1253, 1263 electrically coupled to a plurality of corresponding tap points 1255, 1265 along the clock spines 1250, 1260. In at least one embodiment, one or more advantages described herein are achievable in an IC device having the clock tree 1200C.

Figure 13:
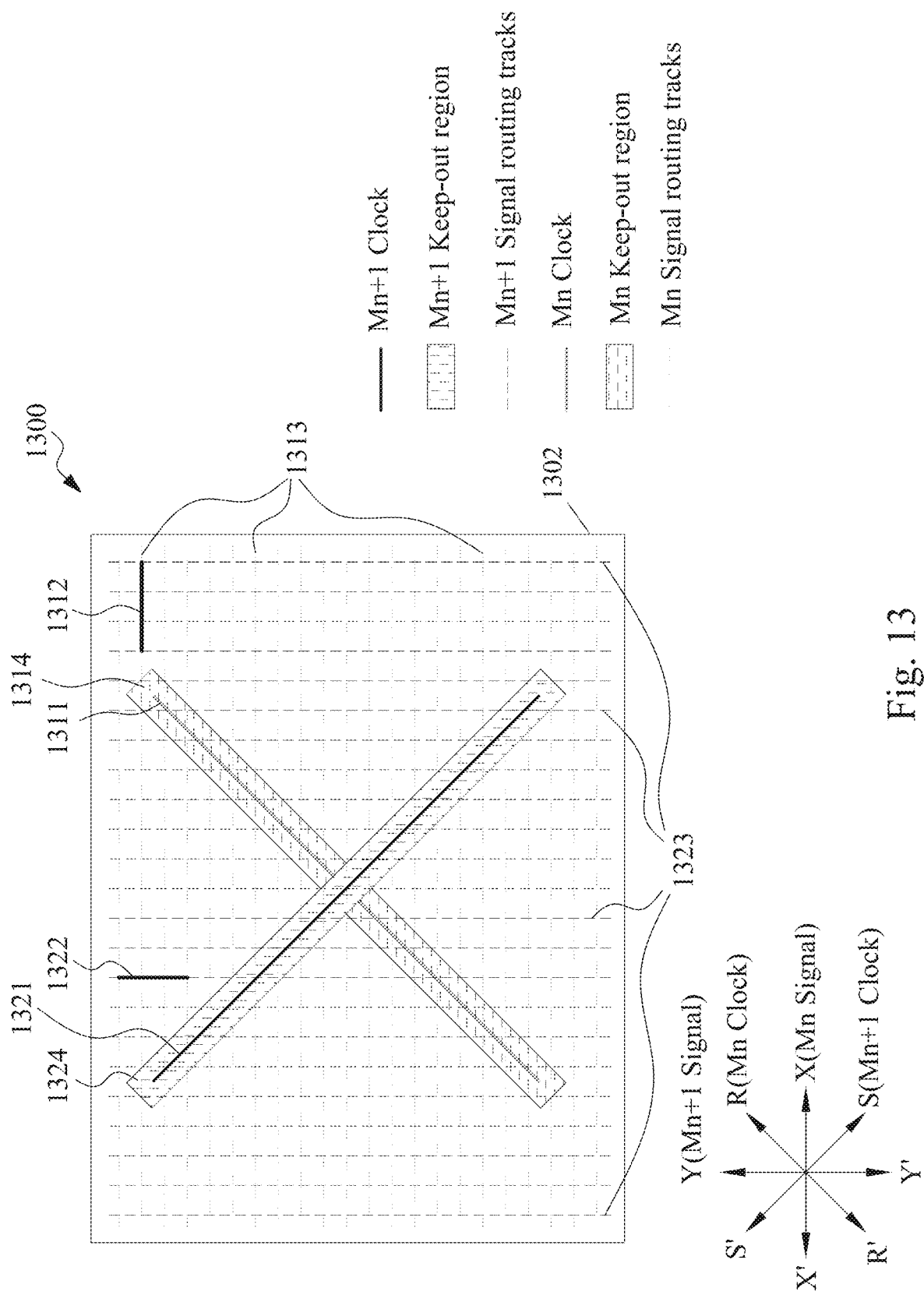
FIG. 13 is a schematic view of a layout of an IC device, in accordance with some embodiments.

FIG. 13 is a schematic view of a layout of an IC device 1300, in accordance with some embodiments. In at least one embodiment, the IC device 1300 comprises a clock distribution system corresponding to the clock distribution system 100, or corresponds to the IC device 200.

The IC device 1300 comprises a substrate 1302 over which a circuit region and an interconnect structure of the IC device 1300 are formed, e.g., as described with respect to FIGS. 2A-2B. Various layers and structures of the IC device 1300 are omitted in FIG. 13 which shows adjacent metal layers Mn and Mn+1 in the interconnect structure of the IC device 1300.

The metal layer Mn comprises a clock metal pattern 1311 extending along an R-R' axis and configured to carry a clock signal. The R-R' axis is oblique to both the X-X' axis and the Y-Y' axis. In at least one embodiment, the clock metal pattern 1311 corresponds to a clock metal pattern in one or more of the clock mesh structures 206, 300-700, or a clock metal pattern in one or more of clock trees 800A, 800B, 900A, 900B, 1000A, 1000B, 1100A, 1100B, 1200A, 1200B, 1200C. The metal layer Mn further comprises at least one signal metal pattern 1312 formed along a corresponding track among a plurality of signal routing tracks 1313. The signal metal pattern 1312 and the signal routing tracks 1313 extend along the X-X' axis. The signal metal pattern 1312 is configured to carry a non-clock signal, such as control, power, data, or the like. In at least one embodiment, all metal patterns in the metal layer Mn and configured to carry non-clock signals are linear, and parallel to the X-X' axis. The metal layer Mn further comprises a keep-out region 1314 which is elongated along the clock metal pattern 1311 and within which an entirety of the clock metal pattern 1311 is arranged. No metal patterns configured to carry non-clock signals in the metal layer Mn are formed in or extend into the keep-out region 1314, to avoid short circuits and/or to reduce interference between the clock signal distributed along the clock metal pattern 1311 and other, non-clock signals.

The metal layer Mn+1 comprises a clock metal pattern 1321 extending along an S-S' axis and configured to carry a clock signal. The S-S' axis is oblique to both the X-X' axis and the Y-Y' axis. In at least one embodiment, the clock metal pattern 1321 corresponds to a clock metal pattern in one or more of the clock mesh structures 206, 300-700, or a clock metal pattern in one or more of clock trees 800A, 800B, 900A, 900B, 1000A, 1000B, 1100A, 1100B, 1200A, 1200B, 1200C. The metal layer Mn+1 further comprises at least one signal metal pattern 1322 formed along a corresponding track among a plurality of signal routing tracks 1323. The signal metal pattern 1322 and the signal routing tracks 1323 extend along the Y-Y' axis. The signal metal pattern 1322 is configured to carry a non-clock signal, such as control, power, data, or the like. In at least one embodiment, all metal patterns in the metal layer Mn+1 and configured to carry non-clock signals are linear, and parallel to the Y-Y' axis. The metal layer Mn+1 further comprises a keep-out region 1324 which is elongated along the clock metal pattern 1321 and within which an entirety of the clock metal pattern 1321 is arranged. No metal patterns configured to carry non-clock signals in the metal layer Mn+1 are formed in or extend into the keep-out region 1324, to avoid short circuits and/or to reduce interference between the clock signal distributed along the clock metal pattern 1321 and other, non-clock signals. For illustrative purposes, the clock metal pattern 1311 and the keep-out region 1314 on the metal layer Mn are shown as being above the signal routing tracks 1323 of the metal layer Mn+1.

In some embodiments, the metal layer containing the clock metal pattern 1311 and the metal layer containing the clock metal pattern 1312 are non-consecutive metal layers. In at least one embodiment, the IC device 1300 includes no metal layer dedicated for oblique metal patterns, and therefore, the described arrangement of at least one oblique metal pattern for a clock signal on the same metal layer as X-axis or Y-axis metal patterns for non-clock signals makes it possible to achieve one or more advantages described herein without adding an additional metal layer to the IC device 1300. In at least one embodiment, at least one of the oblique clock metal patterns 1311, 1321 is configured as a critical net in the clock distribution system of the IC device 1300.

Figure 14:
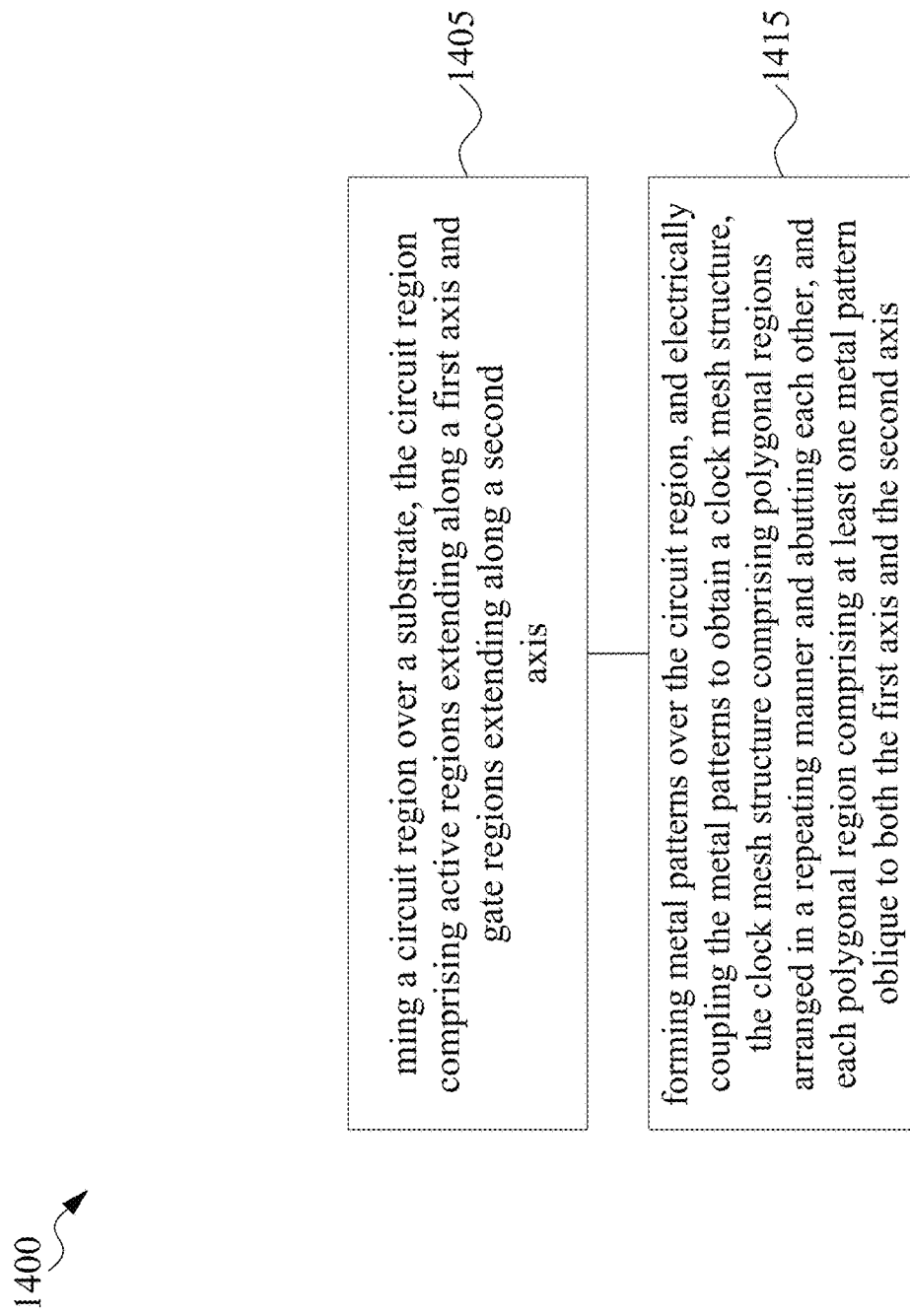
FIG. 14 is a flow chart of a method, in accordance with some embodiments.

FIG. 14 is a flow chart of a method 1400, in accordance with some embodiments. In at least one embodiment, the method 1400 is a method of manufacturing at least one of an IC device comprising the clock distribution system 100, the IC device 200, an IC device comprising one or more of the clock mesh structures 300-700, an IC device comprising one or more of clock trees 800A, 800B, 900A, 900B, 1000A, 1000B, 1100A, 1100B, 1200A, 1200B, 1200C, or the IC device 1300.

At operation 1405, a circuit region is formed over a substrate. The circuit region comprises active regions extending along a first axis, and gate regions extending along a second axis. For example, as described with respect to FIG. 2A a circuit region 204 is formed over a substrate 202, and comprises active regions 211, 212 extending along the X-X' axis, and gate regions 213, 214 extending along the Y-Y' axis.

At operation 1415, metal patterns are formed over the circuit region, and are electrically coupled together to form a clock mesh structure. The clock mesh structure comprises polygonal regions arranged in a repeating manner and abutting each other. Each polygonal region comprises at least one metal pattern oblique to both the first axis and the second axis. For example, as described with respect to FIGS. 2A, 3-7, various metal patterns are formed over the circuit region and electrically coupled together to form a clock mesh structure 206, 300-700. The clock mesh structure comprises polygonal regions, e.g., 220-228, arranged in a repeating manner and abutting each other, as also described with respect to FIGS. 2A, 3-7. Each polygonal region comprises at least one U-axis metal pattern or V-axis metal pattern which is oblique to both the X-X' axis and the Y-Y' axis, as described with respect to the enlarged views of representative polygonal regions in FIGS. 2A, 3-7. In at least one embodiment, one or more advantages described herein are achievable in an IC device manufactured in accordance with the method 1400.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 15:
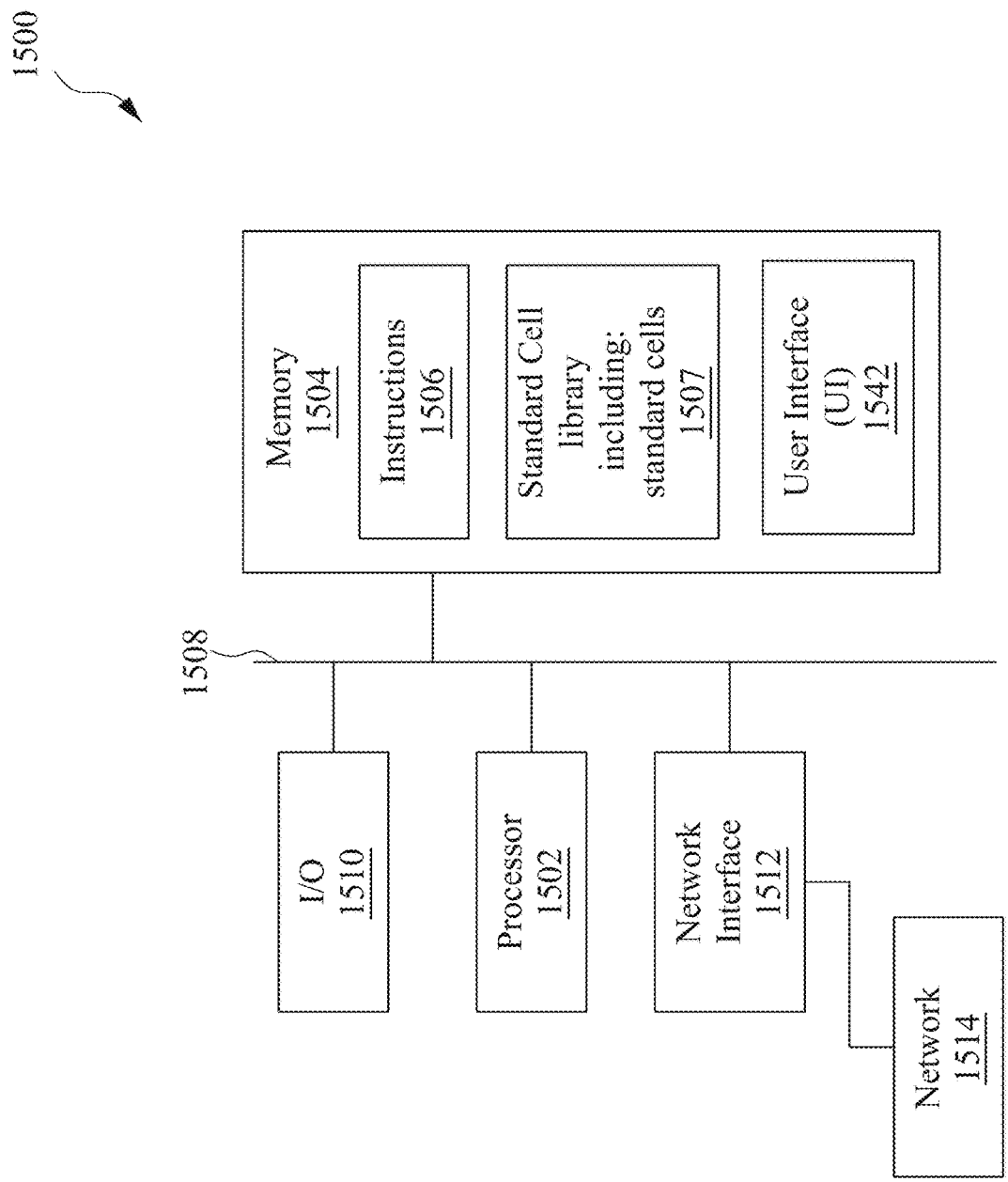
FIG. 15 is a block diagram of an electronic design automation (EDA) system, in accordance with some embodiments.

FIG. 15 is a block diagram of an electronic design automation (EDA) system 1500 in accordance with some embodiments.

In some embodiments, EDA system 1500 includes an APR system. Methods described herein of designing layout diagrams represent wire routing arrangements, in accordance with one or more embodiments, are implementable, for example, using EDA system 1500, in accordance with some embodiments.

In some embodiments, EDA system 1500 is a general purpose computing device including a hardware processor 1502 and a non-transitory, computer-readable storage medium 1504. Storage medium 1504, amongst other things, is encoded with, i.e., stores, computer program code 1506, i.e., a set of executable instructions. Execution of instructions 1506 by hardware processor 1502 represents (at least in part) an EDA tool which implements a portion or all of the methods described herein in accordance with one or more embodiments (hereinafter, the noted processes and/or methods).

Processor 1502 is electrically coupled to computer-readable storage medium 1504 via a bus 1508. Processor 1502 is also electrically coupled to an I/O interface 1510 by bus 1508. A network interface 1512 is also electrically connected to processor 1502 via bus 1508. Network interface 1512 is connected to a network 1514, so that processor 1502 and computer-readable storage medium 1504 are capable of connecting to external elements via network 1514. Processor 1502 is configured to execute computer program code 1506 encoded in computer-readable storage medium 1504 in order to cause system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, computer-readable storage medium 1504 is an electronic, magnetic, optical, electromagnetic, infrared, and/or a semiconductor system (or apparatus or device). For example, computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1504 includes a compact disk-read only memory (CD-ROM), a compact disk-read/write (CD-R/W), and/or a digital video disc (DVD).

In one or more embodiments, storage medium 1504 stores computer program code 1506 configured to cause system 1500 (where such execution represents (at least in part) the EDA tool) to be usable for performing a portion or all of the noted processes and/or methods. In one or more embodiments, storage medium 1504 also stores information which facilitates performing a portion or all of the noted processes and/or methods. In one or more embodiments, storage medium 1504 stores library 1507 of standard cells including such standard cells as disclosed herein.

EDA system 1500 includes I/O interface 1510. I/O interface 1510 is coupled to external circuitry. In one or more embodiments, I/O interface 1510 includes a keyboard, keypad, mouse, trackball, trackpad, touchscreen, and/or cursor direction keys for communicating information and commands to processor 1502.

EDA system 1500 also includes network interface 1512 coupled to processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1500.

System 1500 is configured to receive information through I/O interface 1510. The information received through I/O interface 1510 includes one or more of instructions, data, design rules, libraries of standard cells, and/or other parameters for processing by processor 1502. The information is transferred to processor 1502 via bus 1508. EDA system 1500 is configured to receive information related to a UI through I/O interface 1510. The information is stored in computer-readable medium 1504 as user interface (UI) 1542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1500. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 16:
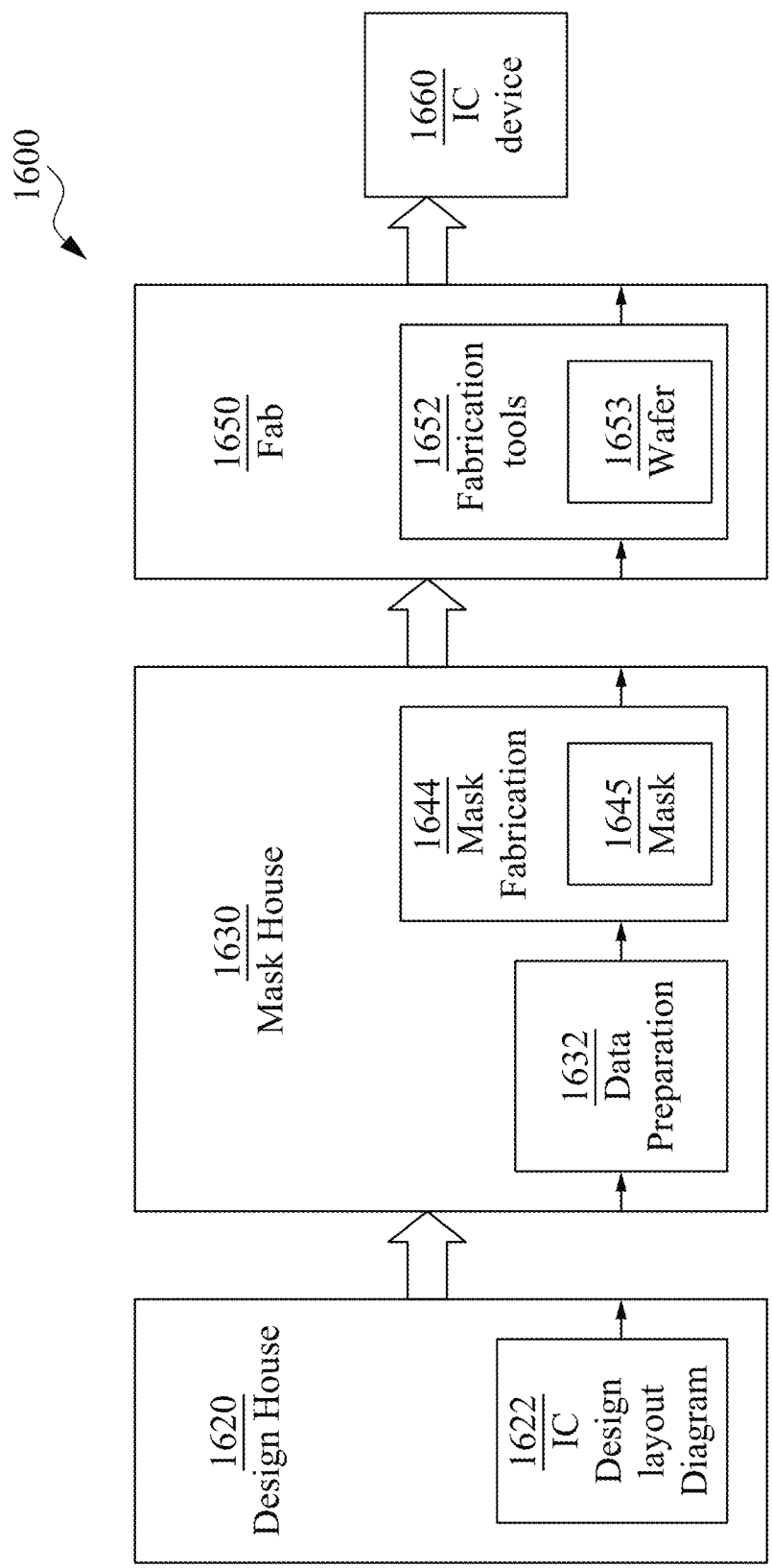
FIG. 16 is a block diagram of an IC manufacturing system and an IC manufacturing flow associated therewith, in accordance with some embodiments.

FIG. 16 is a block diagram of an integrated circuit (IC) manufacturing system 1600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1600.

In FIG. 16, IC manufacturing system 1600 includes entities, such as a design house 1620, a mask house 1630, and an IC manufacturer/fabricator ("fab") 1650, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1620, mask house 1630, and IC fab 1650 is owned by a single larger company. In some embodiments, two or more of design house 1620, mask house 1630, and IC fab 1650 coexist in a common facility and use common resources.

Design house (or design team) 1620 generates an IC design layout diagram 1622. IC design layout diagram 1622 includes various geometrical patterns designed for an IC device 1660. The geometrical patterns correspond to patterns of metal, oxide, or semiconductor layers that make up the various components of IC device 1660 to be fabricated. The various layers combine to form various IC features. For example, a portion of IC design layout diagram 1622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1620 implements a proper design procedure to form IC design layout diagram 1622. The design procedure includes one or more of logic design, physical design or place-and-route operation. IC design layout diagram 1622 is presented in one or more data files having information of the geometrical patterns. For example, IC design layout diagram 1622 can be expressed in a GDSII file format or DFII file format.

Mask house 1630 includes data preparation 1632 and mask fabrication 1644. Mask house 1630 uses IC design layout diagram 1622 to manufacture one or more masks 1645 to be used for fabricating the various layers of IC device 1660 according to IC design layout diagram 1622. Mask house 1630 performs mask data preparation 1632, where IC design layout diagram 1622 is translated into a representative data file (RDF). Mask data preparation 1632 provides the RDF to mask fabrication 1644. Mask fabrication 1644 includes a mask writer. A mask writer converts the RDF to an image on a substrate, such as a mask (reticle) 1645 or a semiconductor wafer 1653. The design layout diagram 1622 is manipulated by mask data preparation 1632 to comply with particular characteristics of the mask writer and/or requirements of IC fab 1650. In FIG. 16, mask data preparation 1632 and mask fabrication 1644 are illustrated as separate elements. In some embodiments, mask data preparation 1632 and mask fabrication 1644 can be collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout diagram 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1632 includes a mask rule checker (MRC) that checks the IC design layout diagram 1622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1622 to compensate for limitations during mask fabrication 1644, which may undo part of the modifications performed by OPC in order to meet mask creation rules.

In some embodiments, mask data preparation 1632 includes lithography process checking (LPC) that simulates processing that will be implemented by IC fab 1650 to fabricate IC device 1660. LPC simulates this processing based on IC design layout diagram 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1622.

It should be understood that the above description of mask data preparation 1632 has been simplified for the purposes of clarity. In some embodiments, data preparation 1632 includes additional features such as a logic operation (LOP) to modify the IC design layout diagram 1622 according to manufacturing rules. Additionally, the processes applied to IC design layout diagram 1622 during data preparation 1632 may be executed in a variety of different orders.

After mask data preparation 1632 and during mask fabrication 1644, a mask 1645 or a group of masks 1645 are fabricated based on the modified IC design layout diagram 1622. In some embodiments, mask fabrication 1644 includes performing one or more lithographic exposures based on IC design layout diagram 1622. In some embodiments, an electron-beam (e-beam) or a mechanism of multiple e-beams is used to form a pattern on a mask (photomask or reticle) 1645 based on the modified IC design layout diagram 1622. Mask 1645 can be formed in various technologies. In some embodiments, mask 1645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1645 includes a transparent substrate (e.g., fused quartz) and an opaque material (e.g., chromium) coated in the opaque regions of the binary mask. In another example, mask 1645 is formed using a phase shift technology. In a phase shift mask (PSM) version of mask 1645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1644 is used in a variety of processes. For example, such a mask(s) is used in an ion implantation process to form various doped regions in semiconductor wafer 1653, in an etching process to form various etching regions in semiconductor wafer 1653, and/or in other suitable processes.

IC fab 1650 is an IC fabrication business that includes one or more manufacturing facilities for the fabrication of a variety of different IC products. In some embodiments, IC Fab 1650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1650 includes fabrication tools 1652 configured to execute various manufacturing operations on semiconductor wafer 1653 such that IC device 1660 is fabricated in accordance with the mask(s), e.g., mask 1645. In various embodiments, fabrication tools 1652 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1650 uses mask(s) 1645 fabricated by mask house 1630 to fabricate IC device 1660. Thus, IC fab 1650 at least indirectly uses IC design layout diagram 1622 to fabricate IC device 1660. In some embodiments, semiconductor wafer 1653 is fabricated by IC fab 1650 using mask(s) 1645 to form IC device 1660. In some embodiments, the IC fabrication includes performing one or more lithographic exposures based at least indirectly on IC design layout diagram 1622. Semiconductor wafer 1653 includes a silicon substrate or other proper substrate having material layers formed thereon. Semiconductor wafer 1653 further includes one or more of various doped regions, dielectric features, multi-level interconnects, and the like (formed at subsequent manufacturing steps).

Details regarding an integrated circuit (IC) manufacturing system (e.g., system 1600 of FIG. 16), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a clock distribution system comprises a clock mesh structure comprising a plurality of first metal patterns extending along a first axis, a plurality of second metal patterns extending along a second axis, a plurality of third metal patterns extending along a third axis. The plurality of first metal patterns, the plurality of second metal patterns, and the plurality of third metal patterns are electrically coupled with each other. The second axis is transverse to the first axis. The third axis is oblique to both the first axis and the second axis.

An integrated circuit (IC) device comprises a substrate, a circuit region over the substrate, and a clock distribution system over and electrically coupled to the circuit region. The circuit region comprises at least one active region extending along a first axis, and at least one gate region extending across the at least one active region and along a second axis transverse to the first axis. The clock distribution system is configured to supply a clock signal to the circuit region. The clock distribution system comprises, in a first metal layer over the circuit region, at least one first metal pattern oblique to both the first axis and the second axis. The clock distribution system further comprises, in a second metal layer over the circuit region, at least one second metal pattern transverse to the at least one first metal pattern and oblique to both the first axis and the second axis.

In some embodiments, a method comprises forming a circuit region over a substrate, forming a plurality of metal patterns over the circuit region, and electrically coupling the plurality of metal patterns to form a clock mesh structure. The circuit region comprises a plurality of active regions extending along a first axis, and a plurality of gate regions extending across the plurality of active regions and along a second axis transverse to the first axis. The clock mesh structure comprises a plurality of polygonal regions arranged in a repeating manner and abutting each other. Each of the plurality of polygonal regions comprises therein at least one metal pattern among the plurality of metal patterns which is oblique to both the first axis and the second axis.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock distribution system, comprising:
    a clock mesh structure comprising:
        a plurality of first metal patterns extending along a first axis,
        a plurality of second metal patterns extending along a second axis, and
        a plurality of third metal patterns extending along a third axis,
    wherein
    the plurality of first metal patterns, the plurality of second metal patterns, and the plurality of third metal patterns are electrically coupled with each other,
    the second axis is transverse to the first axis,
    the third axis is oblique to both the first axis and the second axis,
    the plurality of first metal patterns comprises a main first metal pattern, and other first metal patterns different from the main first metal pattern, the plurality of second metal patterns comprises a main second metal pattern, and other second metal patterns different from the main second metal pattern, the plurality of third metal patterns comprises a main third metal pattern, the main first metal pattern overlaps the main second metal pattern and the main third metal pattern, without overlapping the other second metal patterns, and the main third metal pattern overlaps the main second metal pattern, one or more of the other first metal patterns, and one or more of the other second metal patterns.

2. The clock distribution system of claim 1, further comprising a clock driver, wherein the main first metal pattern, the main second metal pattern and the main third metal pattern are electrically coupled to the clock driver to receive a clock signal from the clock driver and to distribute the clock signal throughout the clock mesh structure.

3. The clock distribution system of claim 2, further comprising a plurality of further clock drivers or clock loads, wherein the plurality of further clock drivers or clock loads have inputs coupled to corresponding points in the clock mesh structure to receive the clock signal from the clock mesh structure.

4. The clock distribution system of claim 1, wherein the clock mesh structure further comprises a plurality of fourth metal patterns extending along a fourth axis, and electrically coupled to the plurality of first metal patterns, the plurality of second metal patterns and the plurality of third metal patterns, and the fourth axis is transverse to the third axis, and is oblique to both the first axis and the second axis.

5. The clock distribution system of claim 4, wherein the plurality of fourth metal patterns comprises a main fourth metal pattern, and the main first metal pattern, the main second metal pattern, the main third metal pattern and the main fourth metal pattern all overlap each other at a center of the clock mesh structure.

6. The clock distribution system of claim 5, wherein the plurality of third metal patterns comprises other third metal patterns different from the main third metal pattern, the plurality of fourth metal patterns comprises other fourth metal patterns different from the main fourth metal pattern, the other first metal patterns, the other second metal patterns, the other third metal patterns and the other fourth metal patterns form a plurality of polygons.

7. The clock distribution system of claim 5, wherein the plurality of third metal patterns comprises other third metal patterns different from the main third metal pattern, the plurality of fourth metal patterns comprises other fourth metal patterns different from the main fourth metal pattern, the main first metal pattern overlaps one or more of the other third metal patterns and one or more of the other fourth metal patterns, without overlapping the other second metal patterns, the main second metal pattern overlaps one or more of the other third metal patterns and one or more of the other fourth metal patterns, without overlapping the other first metal patterns, the main third metal pattern does not overlap the other fourth metal patterns, and the main fourth metal pattern overlaps one or more of the other first metal patterns and one or more of the other second metal patterns, without overlapping the other third metal patterns.

8. The clock distribution system of claim 4, wherein the clock mesh structure comprises a plurality of polygonal regions arranged in a repeating manner and abutting each other, and for each corner of each polygonal region among the plurality of polygonal regions, a metal pattern among the plurality of first metal patterns, the plurality of second metal patterns, the plurality of third metal patterns or the plurality of fourth metal patterns extends from inside the polygonal region to the corner.

9. The clock distribution system of claim 1, wherein the other first metal patterns are shorter than the main first metal pattern, and the other second metal patterns are shorter than the main second metal pattern.

10. An integrated circuit (IC) device, comprising:

a substrate;

a circuit region over the substrate, the circuit region comprising:

at least one active region extending along a first axis, and at least one gate region extending across the at least one active region and along a second axis transverse to the first axis; and a clock distribution system over and electrically coupled to the circuit region, the clock distribution system configured to supply a clock signal to the circuit region, the clock distribution system comprising:

in a first metal layer over the circuit region, a first metal pattern oblique to both the first axis and the second axis, and a pair of first shielding metal patterns arranged along and on opposite sides of the first metal pattern, in a second metal layer over the circuit region, a second metal pattern transverse to the first metal pattern and oblique to both the first axis and the second axis, and a pair of second shielding metal patterns arranged along and on opposite sides of the second metal pattern, and in a third metal layer over the circuit region, a third metal pattern extending along the first axis or the second axis, wherein the third metal pattern overlaps and is electrically coupled to the first metal pattern and the second metal pattern, and a pair of third shielding metal patterns arranged along and on opposite sides of the third metal pattern, wherein each of the first shielding metal patterns, the second shielding metal patterns, and the third shielding metal patterns is configured to receive a power supply voltage.

11. The IC device of claim 10, wherein the clock distribution system comprises:

in the first metal layer, a plurality of first metal patterns including the first metal pattern, in the second metal layer, a plurality of second metal patterns including the second metal pattern, and a plurality of via structures electrically coupling the plurality of first metal patterns and the plurality of second metal patterns, to form a clock mesh structure.

12. The IC device of claim 10, wherein
the clock distribution system further comprises a clock driver having an output electrically coupled to the third metal pattern, to form at least a portion of a clock tree.

13. The IC device of claim 10, wherein
the clock distribution system further comprises:
in the first metal layer, a further first metal pattern,
in the second metal layer, a further second metal pattern, and
the third metal pattern has opposite ends each of which overlaps and is electrically coupled to
a corresponding one of the first metal pattern and the further first metal pattern, and
a corresponding one of the second metal pattern and the further second metal pattern.

14. The IC device of claim 13, wherein
the clock distribution system further comprises:
in the first metal layer, a pair of further first shielding metal patterns arranged along and on opposite sides of the further first metal pattern,
in the second metal layer, a pair of further second shielding metal patterns arranged along and on opposite sides of the further second metal pattern, and
each of the further first shielding metal patterns and the further second shielding metal patterns is configured to receive a power supply voltage.

15. The IC device of claim 14, wherein
the clock distribution system further comprises further shielding metal patterns each of which
extends across a corresponding metal pattern among the first metal pattern, the further first metal pattern, the second metal pattern, the further second metal pattern, and the third metal pattern, and
overlaps and is electrically coupled to a corresponding pair of shielding metal patterns among the pair of first shielding metal patterns, the pair of further first shielding metal patterns, the pair of second shielding metal patterns, the pair of further second shielding metal patterns, and the pairs of third shielding metal patterns.

16. The IC device of claim 15, wherein
the clock distribution system further comprises a clock driver having an output electrically coupled to the third metal pattern at a midpoint between the opposite ends of the third metal pattern.

17. The IC device of claim 10, further comprising:
in the first metal layer,
at least one first signal metal pattern extending along the first axis, and
a first keep-out region which is elongated along the first metal pattern, within which an entirety of the first metal pattern is arranged, and within which the at least one first signal metal pattern is not arranged; and
in the second metal layer,
at least one second signal metal pattern extending along the second axis, and
a second keep-out region which is elongated along the second metal pattern, within which an entirety of the second metal pattern is arranged, and within which the at least one second signal metal pattern is not arranged.

18. A method, comprising:
forming a circuit region over a substrate, the circuit region comprising:
a plurality of active regions extending along a first axis, and
a plurality of gate regions extending across the plurality of active regions and along a second axis transverse to the first axis; and
forming a plurality of metal patterns over the circuit region, and electrically coupling the plurality of metal patterns to form a clock mesh structure, wherein
the clock mesh structure comprises, in a first metal layer over the circuit region,
at least one first metal pattern among the plurality of metal patterns,
the at least one first metal pattern is oblique to both the first axis and the second axis, and
said method further comprises forming, in the first metal layer,
at least one first signal metal pattern extending along one of the first axis and the second axis, and
a first keep-out region which is elongated along the at least one first metal pattern, within which an entirety of the at least one first metal pattern is arranged, and within which the at least one first signal metal pattern is not arranged.

19. The method of claim 18, wherein
the clock mesh structure further comprises, in a second metal layer over the circuit region, at least one second metal pattern among the plurality of metal patterns, and
the at least one second metal pattern is transverse to the at least one first metal pattern, and oblique to both the first axis and the second axis.

20. The method of claim 19, further comprising:
forming, in the second metal layer,
at least one second signal metal pattern extending along the other of the first axis and the second axis, and
a second keep-out region which is elongated along the at least one second metal pattern, within which an entirety of the at least one second metal pattern is arranged, and within which the at least one second signal metal pattern is not arranged.

\* \* \* \* \*